United States Patent
Kon

(10) Patent No.: US 8,860,211 B2
(45) Date of Patent: Oct. 14, 2014

(54) SEMICONDUCTOR DEVICE, SEMICONDUCTOR DEVICE MANUFACTURING METHOD, AND ELECTRONIC DEVICE

(71) Applicant: Fujitsu Limited, Kawasaki (JP)

(72) Inventor: Junichi Kon, Isehara (JP)

(73) Assignee: Fujitsu Limited, Kawasaki (JP)

( * ) Notice: Subject to any disclaimer, the term of this patent is extended or adjusted under 35 U.S.C. 154(b) by 34 days.

(21) Appl. No.: 13/648,397

(22) Filed: Oct. 10, 2012

(65) Prior Publication Data

US 2013/0154082 A1 Jun. 20, 2013

(30) Foreign Application Priority Data

Dec. 16, 2011 (JP) ................. 2011-275523

(51) Int. Cl.
*H01L 23/34* (2006.01)
(52) U.S. Cl.
USPC ....... 257/713; 257/723; 257/E23.08; 438/122
(58) Field of Classification Search
USPC ................. 257/713, 723, E21.505, E23.08; 438/122
See application file for complete search history.

(56) References Cited

U.S. PATENT DOCUMENTS

| | | | |
|---|---|---|---|
| 5,422,514 A * | 6/1995 | Griswold et al. | ............ 257/679 |
| 5,497,033 A | 3/1996 | Fillion | |
| 7,202,107 B2 | 4/2007 | Fuergut | |
| 2003/0137057 A1 | 7/2003 | Honda | |
| 2006/0267222 A1 | 11/2006 | Saito | |
| 2009/0283895 A1 | 11/2009 | Kikuchi et al. | |

FOREIGN PATENT DOCUMENTS

| | | |
|---|---|---|
| JP | 5-109942 | 4/1993 |
| JP | H7-7134 | 1/1995 |
| JP | 2003-289120 A1 | 10/2003 |
| JP | 2004-103955 A1 | 4/2004 |
| JP | 2009-272512 A1 | 11/2009 |
| JP | 2010-141173 A1 | 6/2010 |
| KR | 10-2006-0124532 | 12/2006 |

OTHER PUBLICATIONS

Notice of Preliminary Rejection mailed Dec. 2, 2013 from the Korean Intellectual Property Office in counterpart application No. 10-2012-119499 with English translation.
Korean Office Action issued for Korean Patent Application No. 10-2014-12240 dated May 7, 2014.

* cited by examiner

*Primary Examiner* — Roy Potter
(74) *Attorney, Agent, or Firm* — Kratz, Quintos & Hanson, LLP

(57) ABSTRACT

A semiconductor device includes an insulation layer, a first semiconductor element and a second semiconductor element which are disposed within the insulation layer, a frame which has higher thermal conductivity than the insulation layer and surrounds the first semiconductor element and the second semiconductor element via the insulation layer, and a wiring layer which is disposed over the insulation layer and includes an electrode which electrically connects the first semiconductor element and the second semiconductor element.

20 Claims, 28 Drawing Sheets

SEMICONDUCTOR DEVICE, SEMICONDUCTOR DEVICE MANUFACTURING METHOD, AND ELECTRONIC DEVICE

CROSS-REFERENCE TO RELATED APPLICATION

This application is based upon and claims the benefit of priority of the prior Japanese Patent Application No. 2011-275523, filed on Dec. 16, 2011, the entire contents of which are incorporated herein by reference.

FIELD

The embodiments discussed herein are related to a semiconductor device and a semiconductor device manufacturing method, and an electronic device employing the semiconductor device.

BACKGROUND

As digitalization of electronic equipment including recent personal digital assistants and so forth pass progressed, further multi-functionality and higher performance have been demanded for semiconductor elements (semiconductor chips). In order to satisfy these demands, with semiconductor chip manufacturing technology, while miniaturization of dimensions of elements and wiring thereof has been advanced, and with mounting technology, high integration has been advanced. As an example wherein such high integration has been advanced, there have been known semiconductor devices of forms including such as a multi-chip package (MCP) wherein multiple semiconductor chips are housed in one package, or multi-chip module (MCM).

Also, with a manufacturing field of a semiconductor device including a semiconductor element, there has been known technology employing an auxiliary member such as stiffener or the like which suppresses occurrence of warpage and so forth due to material used for the semiconductor device.

Japanese Laid-open Patent Publication Nos. 7-007134, 2004-103955, 2010-141173, 2003-289120, and 2009-272512 are examples of the related art.

With such a semiconductor device in an MCP mode, multiple semiconductor chips are provided within an insulating layer made up of a resin or the like, for example. A wiring layer including wiring electrically connected to multiple semiconductor chips, and so forth is provided over such an insulating layer.

SUMMARY

According to an aspect of the invention, semiconductor device includes an insulation layer, a first semiconductor element and a second semiconductor element which are disposed within the insulation layer, a frame which has higher thermal conductivity than the insulation layer and surrounds the first semiconductor element and the second semiconductor element via the insulation layer, and a wiring layer which is disposed over the insulation layer and includes an electrode which electrically connects the first semiconductor element and the second semiconductor element.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First, a first embodiment will be described.

Figure 1:
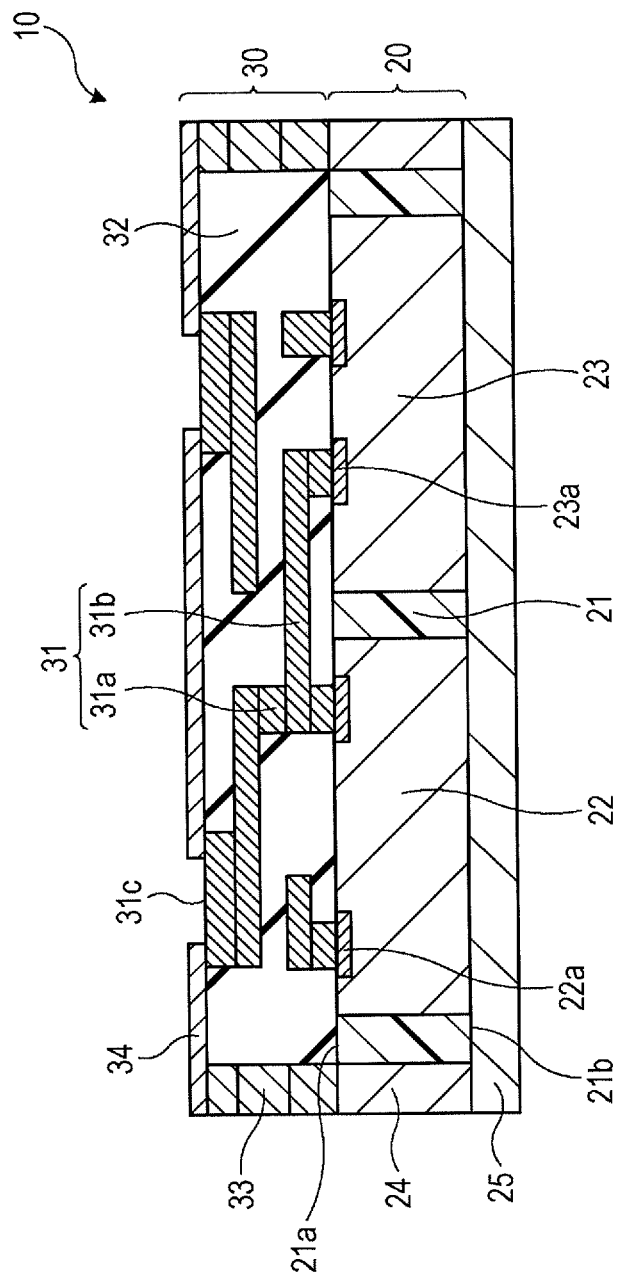
FIG. 1 is a diagram illustrating a configuration example of a semiconductor device.

FIG. 1 is a diagram illustrating a configuration example of a semiconductor device. FIG. 1 schematically illustrates the cross section of an example of the semiconductor device.

A semiconductor device (MCP) 10 illustrated in FIG. 1 includes a built-in chip substrate (substrate) 20, and a wiring layer 30 provided over the built-in chip substrate 20. The built-in chip substrate 20 includes a resin (insulating layer) 21, a semiconductor chip (semiconductor element) 22, and semiconductor chip (semiconductor element) 23. A thermal dissipation layer 25 is provided onto one face of the built-in chip substrate 20. The wiring layer 30 includes an electrode 31, an insulating portion 32, a frame portion 33, and a protective film 34.

As for the resin 21 of the built-in chip substrate 20, an epoxy resin is employed, for example. Note that as for the resin 21, in addition to an epoxy resin, a material such as a phenol resin, melamine resin, polyurethane resin, polyimide resin, or the like may be employed. Also, non-conducting filler such as silica may be included in the resin 21.

The semiconductor chips 22 and 23 are disposed in parallel within the resin 21. The semiconductor chips 22 and 23 are disposed in parallel within the resin 21 so that the resin 21 lies therebetween, i.e., with a predetermined interval therebetween. The semiconductor chip 22 includes a terminal (electrode pad) 22a (two terminals are illustrated here as an example). The electrode pads 22a of the semiconductor chip 22 are exposed from one face (surface) 21a of the resin 21. The semiconductor chip 23 includes a terminal (electrode pad) 23a (two terminals are illustrated here as an example). The electrode pads 23a of the semiconductor chip 23 are exposed from the surface 21a of the resin 21 in the same way as with the electrode pads 22a of the semiconductor chip 22.

The frame 24 is provided so as to surround the resin 21 of the circumferences of the semiconductor chips 22 and 23 provided within the resin 21. The frame 24 is provided to the circumferences of the semiconductor chips 22 and 23 so that the resin 21 lies between the semiconductor chip 22 and the frame 24, and between the semiconductor chip 23 and the frame 24.

As for the frame 24, a material having higher thermal conductivity than the resin 21, or a material having both of higher thermal conductivity and moisture resistance than the resin 21 is employed. As for the material of the frame 24, metal such as copper (Cu) or the like, semiconductor such as silicon (Si) or the like, polysilicon, or a compound semiconductor is employed, for example. Additionally, as for the material of the frame 24, silicon carbide (SiC), silicon nitride (SiN), silicon oxide (SiO), silicon oxynitride (SiON), diamond like carbon, aluminum oxide (AlO), or aluminum nitride (AlN) is employed, for example. As for the frame 24, of these materials, a single type of material may be employed, or a combination of multiple types of materials may be employed.

The thermal dissipation layer 25 is provided on a face (rear face) 21b side opposite of the surface 21a of the resin 21 where the electrode pads 22a of the semiconductor chip 22 of the built-in chip substrate 20 and the electrode pads 23a of the semiconductor chip 23 are exposed, which is connected to the frame 24. As for the thermal dissipation layer 25, in the same way as with the frame 24, a material having higher thermal conductivity than the resin 21, or a material having both of higher thermal conductivity and moisture resistance than the resin 21 is employed. As for the thermal dissipation layer 25, metal, Si, polysilicon, compound semiconductor, SiC, SiN, SiO, SiON, diamond like carbon, AlO, AlN, or the like is employed, for example.

The electrode 31 of the wiring layer 30 provided over such a built-in chip substrate 20 includes a via 31a and a wiring 31b which have a predetermined shape and arrangement and are provided within the insulating portion 32 such as polyimide, SiO, or the like. As for the electrode 31, a material such as Cu or the like may be employed, for example. The electrode 31 is electrically connected to the electrode pads 22a of the semiconductor chip 22 and the electrode pads 23a of the semiconductor chip 23.

The frame portion 33 is provided to the outer circumferential portion of the wiring layer 30, connected to the frame 24 of the built-in chip substrate 20 so as to surround an area where the electrode 31 is included. As for the frame portion 33, the same material (e.g., Cu) as with the electrode 31 is employed, for example. Also, as for the frame portion 33, a material having predetermined thermal conductivity (e.g., higher thermal conductivity than the resin 21 and insulating portion 32), or a material having both of predetermined thermal conductivity and moisture resistance may be employed. The frame portion 33 is formed at the time of forming the wiring layer 30 along with the electrode 31 or after forming the electrode 31, for example.

The protective film 34 is provided to the surface of the wiring layer 30. A portion of the electrode 31 serving as an external connection pad 31c of the semiconductor device 10 is exposed from the protective film 34. For example, the semiconductor device 10 is mounted on another electronic part such as a circuit substrate or the like via a bump such as solder ball or the like provided to the external connection pad 31c.

As described above, with the semiconductor device 10, the frame 24 is provided so as to surround the semiconductor chips 22 and 23 provided within the resin 21. Further, with this semiconductor device 10, the thermal dissipation layer 25 is provided so as to be connected to the frame 24. As for the frame 24 and thermal dissipation layer 25, a material having higher thermal conductivity than the resin 21 is employed. Therefore, heat generated at the time of operations of the semiconductor chips 22 and 23 is transferred from the resin 21 to the frame 24 and thermal dissipation layer 25, and is effectively radiated from the frame 24 and thermal dissipation layer 25 to the outside of the semiconductor device 10. The heat generated from the semiconductor chips 22 and 23 is more effectively radiated to the outside as compared to a configuration wherein the semiconductor chips 22 and 23 are sealed with the resin 21 without providing such frame 24 and thermal dissipation layer 25.

Further, the frame 24 and thermal dissipation layer 25 may have a function serving as a layer (moisture resistance layer) which suppresses moisture from infiltrating in the semiconductor chips 22 and 23 provided within the resin 21. The moisture resistance of the semiconductor device 10 may be improved by providing the frame 24 and thermal dissipation layer 25 having such a function being provided to the built-in chip substrate 20.

Also, with the semiconductor device 10, the frame portion 33 is provided to the outer circumferential portion of the wiring layer 30, and this frame portion 33 is provided so as to be connected to the frame 24 of the built-in chip substrate 20. Thus, the heat transferred to the frame 24 is further effectively transferred to the frame portion 33 of the wiring layer 30 and radiated to the outside. Therefore, the frame 24 and thermal dissipation layer 25 are provided to the built-in chip substrate 20 as described above, and also, such a frame portion 33 is provided to the wiring layer 30, and accordingly, further improvement in thermal dissipation is realized as compared to a case where such frame portion 33 is not provided.

Further, this frame portion 33 may have a function serving as a moisture resistance layer which suppresses moisture from infiltrating to the wiring layer 30, or to the built-in chip substrate 20 from the wiring layer 30. The frame 24 and thermal dissipation layer 25 are provided to the built-in chip substrate 20 as described above, and also, such a frame portion 33 having such a function is provided to the wiring layer 30, and accordingly, further improvement in moisture resistance is realized as compared to a case where such frame portion 33 is not provided.

Note that the configuration of the semiconductor device is not restricted to the above-mentioned example. FIGS. 2A through 2D are diagrams illustrating another configuration example of the semiconductor device.

Figure 2A:
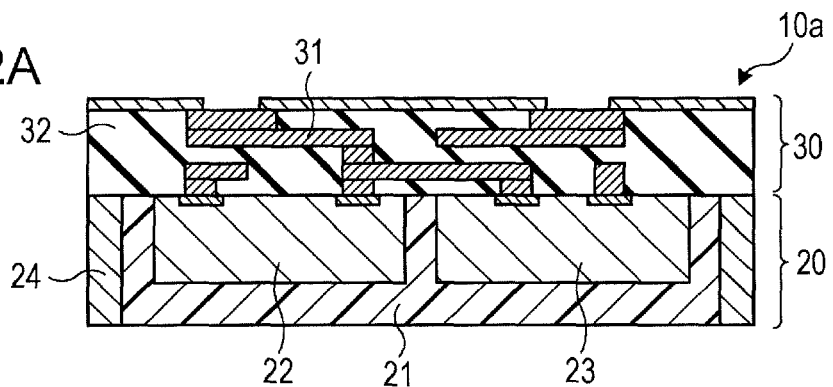
FIGS. 2A through 2D are diagrams illustrating another configuration example of the semiconductor device.

For example, such as a semiconductor device 10a illustrated in FIG. 2A, the frame 24 which surrounds the semiconductor chips 22 and 23 provided with the resin 21 may be provided so as not to provide the above-mentioned thermal dissipation layer 25 and frame portion 33. Even in the event of employing such a configuration, a predetermined thermal dissipation improvement advantage may be obtained by providing the frame 24, and further, a predetermined moisture resistance improvement advantage may be obtained by reducing the area of the exposed resin 21.

Figure 2B:
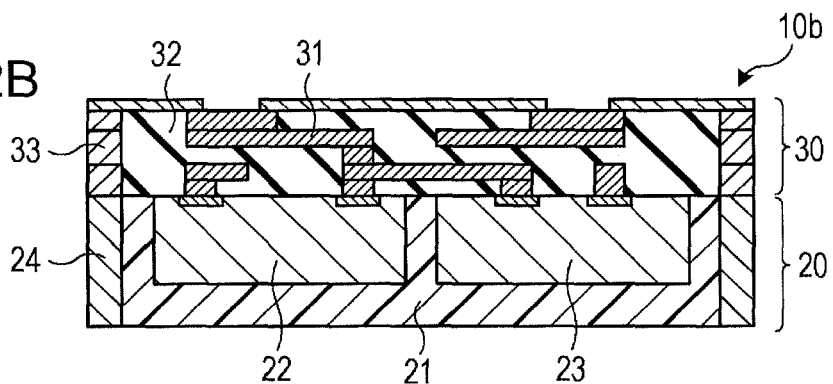

Also, such as a semiconductor device 10b illustrated in FIG. 2B, the frame 24 and frame portion 33 may be provided without providing the above-mentioned thermal dissipation layer 25. Even in the event of employing such a configuration, a predetermined thermal dissipation improvement advantage may be obtained by providing the frame 24 and frame portion 33. Further, a predetermined moisture resistance improvement advantage may be obtained by reducing the areas of the exposed resin 21 and insulating layer 32.

Figure 2C:
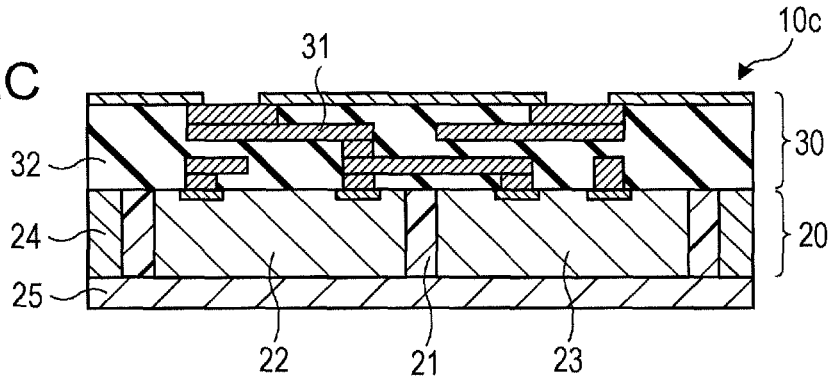

Also, such as a semiconductor device 10c illustrated in FIG. 2C, the frame 24 and thermal dissipation layer 25 may be provided without providing the above-mentioned frame portion 33. Even in the event of employing such a configuration, a predetermined thermal dissipation improvement advantage may be obtained by providing the frame 24 and thermal dissipation layer 25, and further, a predetermined moisture resistance improvement advantage may be obtained by reducing the area of the exposed resin 21.

Figure 2D:
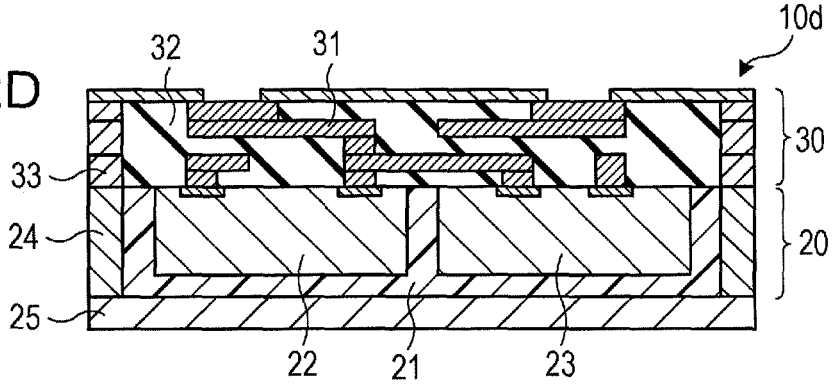

Also, such as a semiconductor device 10d illustrated in FIG. 2D, the thermal dissipation layer 25 may be provided so that the resin 21 lies between the semiconductor chips 22 and 23. Even in the event of employing such a configuration, the heat generated from the semiconductor chips 22 and 23 may be transferred to the thermal dissipation layer 25 via the resin 21 to release the heat from the thermal dissipation layer 25.

Note that, with the above description, though there have been exemplified the semiconductor device 10 where the two semiconductor chips 22 and 23 are provided within the resin 21, and so forth, the number of semiconductor chips to be provided within the resin 21 is not restricted to the above-mentioned examples.

Also, with the above description, though there has been exemplified a case where the semiconductor chips 22 and 23 having the same height (rear face position or thickness) are provided within the resin 21, the semiconductor chips to be provided within the resin 21 do not necessarily have the same height. In the event that semiconductor chips having different height are provided within the resin 21 in this way, there may be a configuration wherein the thermal dissipation layer 25 is directly in contact with one of the semiconductor chips, and the resin 21 lies between the thermal dissipation layer 25 and the other semiconductor chip.

Also, with the above description, though there has been exemplified a case where the semiconductor chips 22 and 23 are provided within the resin 21, in addition to semiconductor chips, a passive part such as a chip condenser or the like, and other electronic parts may be provided within the resin 21.

Also, in the event that both of the frame 24 of the built-in chip substrate 20 and the frame portion 33 of the wiring layer 30 are provided, the widths of these do not necessarily agree. Even in the event that the widths of the frame 24 and frame portion 33 differ, there may be obtained thermal dissipation and moisture resistance improvement advantages as described above at the time of providing both of the frame 24 and frame portion 33 by providing the frame 24 and frame portion 33 which are connected.

Also, with the above description, where both of the frame 24 of the built-in chip substrate 20 and the frame portion 33 of the wiring layer 30 are provided, these are both configured so as to be exposed, but the resin 21 may be provided outside of the frame 24, and the insulating portion 32 may be provided outside of the frame portion 33. Such a configuration, predetermined thermal dissipation and moisture resistance improvement advantages may be obtained.

Also, the patterns of the electrodes 31 of the wiring layers 30 illustrated in FIGS. 1 and 2A through 2D are examples, and are not restricted to the examples in FIGS. 1 and 2A through 2D. The electrodes 31 are taken as patterns according to the modes and arrangement and so forth of semiconductor chips and electronic parts to be provided within the resin 21.

Next, an example of a semiconductor device formation method will be described as second and third embodiments.

First, the second embodiment will be described. Explanatory diagrams of the processes of a semiconductor device formation method according to the second embodiment will be illustrated in FIGS. 3 through 11. Hereafter, the processes will sequentially be described. Now, with a configuration wherein two semiconductor chips are included in one semiconductor device being taken as an example, a formation method thereof will be described.

Figure 3:
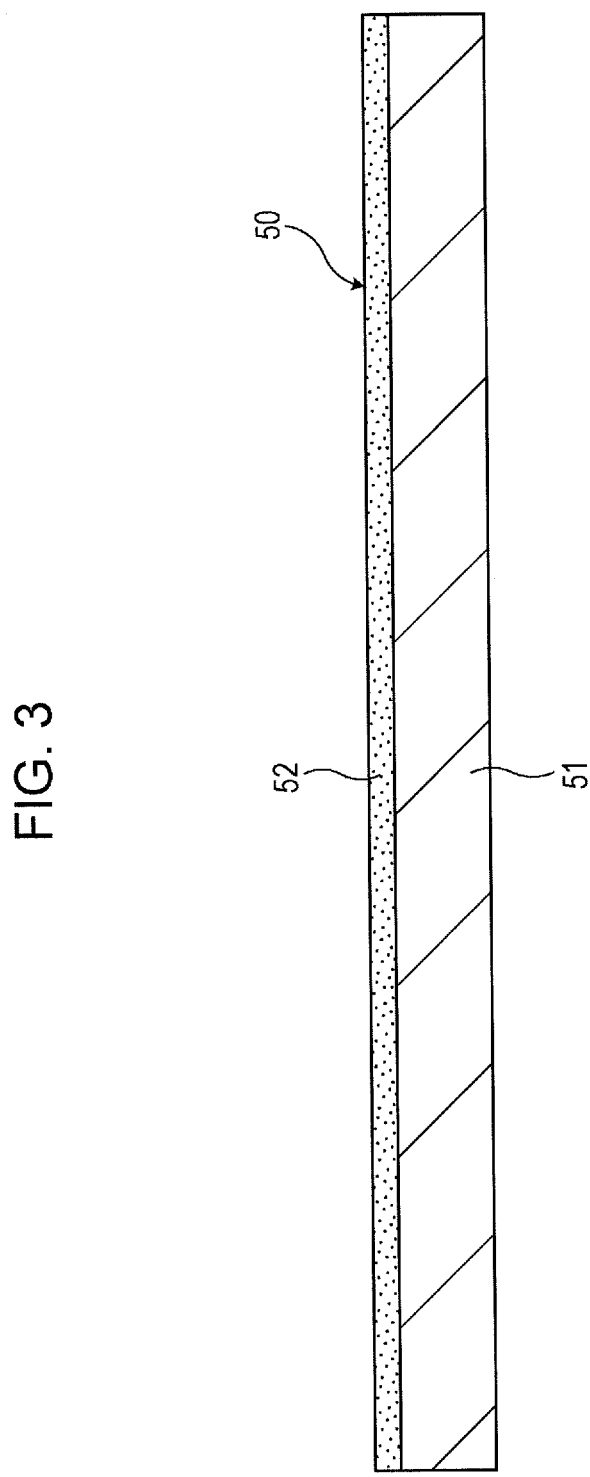
FIG. 3 is an explanatory diagram of a support member preparation process according to a second embodiment.

FIG. 3 is an explanatory diagram of a support member preparation process according to the second embodiment. FIG. 3 schematically illustrates an example of the cross section of the principal portions of a support substrate to be prepared.

With formation of the semiconductor device, first, such as illustrated in FIG. 3, a support member 50 where an adhesive agent 52 is provided onto a support substrate 51, is prepared. It is desirable that the support substrate 51 has the same shape as with an Si wafer to be used at the time of manufacturing a semiconductor chip so as to use the same manufacturing equipment as with a wafer process in the following process. For example, as for the support substrate 51, a glass substrate with 8-inch diameter (about 200 mm) and 1-mm thickness is employed. As for the adhesive agent 52, a heat sensitive adhesive agent, e.g., a thermoplastic resin is employed. Such adhesive agent 52 is applied onto the support substrate 51 to obtain the support member 50 as illustrated in FIG. 3.

Figure 4:
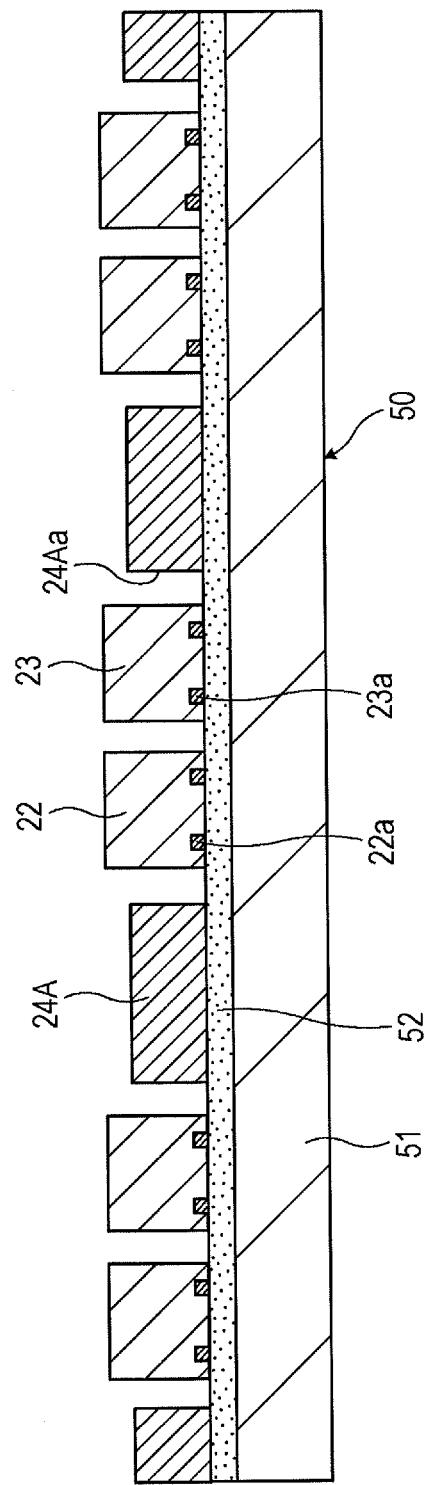
FIG. 4 is an explanatory diagram (Part 1) of an arrangement process of a frame and semiconductor chip according to the second embodiment.
Figure 5:
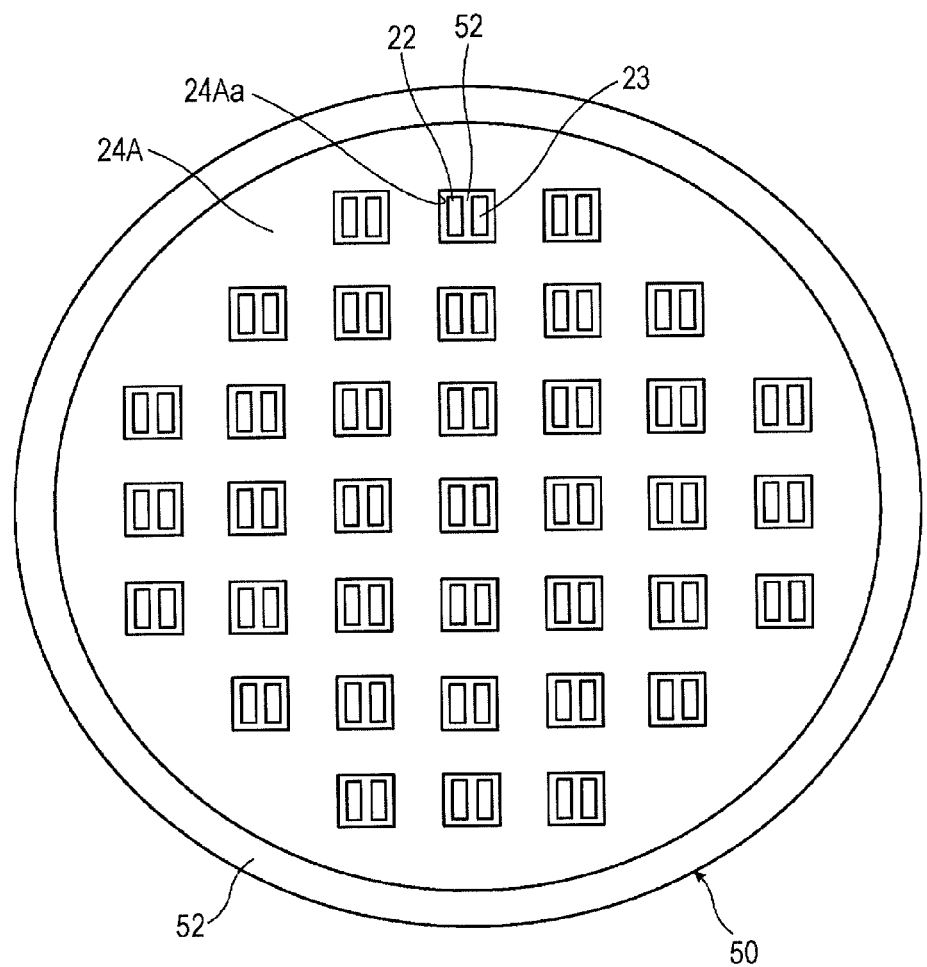
FIG. 5 is an explanatory diagram (Part 2) of the arrangement process of a frame and semiconductor chip according to the second embodiment.

FIGS. 4 and 5 are explanatory diagrams of an arrangement process of a frame and semiconductor chip according to the second embodiment. FIG. 4 schematically illustrates an example of the cross section of the principal portions in a state in which the frame and semiconductor chip are disposed. FIG. 5 schematically illustrates an example of the plane in a state in which the frame and semiconductor chip are disposed.

After the support member 50 is prepared, a frame 24A and the semiconductor chips 22 and 23 are disposed in predetermined positions on a face where the adhesive agent 52 of the support member 50 is provided, respectively. As for the frame 24A, there is employed one sheet of plate-shaped frame where an opening 24Aa is provided to each of areas where the semiconductor chips 22 and 23 of each set is disposed. For example, such a plate-shaped frame 24A is disposed on the adhesive agent 52 of the support member 50, and the semiconductor chips 22 and 23 are disposed on the openings 24Aa of the disposed frame 24A with electrode pads 22a and 23a being directed to the adhesive agent 52 side. As for arrangement of the semiconductor chips 22 and 23, die bonder is employed, for example. The frame 24A and semiconductor chips 22 and 23 are adhesively fixed onto the support member 50 by the adhesive agent 52.

Note that, as for the semiconductor chips 22 and 23, semiconductor chips with a size of 5-mm length×3-mm width× 0.6-mm thickness is employed, for example. For example, there are employed chips made from Cu with 0.5 through 0.6-mm thickness where an opening 24Aa with 6-mm length×7.5-mm width is provided. The semiconductor chips 22 and 23 are disposed on each of the opening portions 24Aa assuming that distance therebetween is taken as 0.5 mm, and distance between the semiconductor chip 22 and the frame 24A (edge of the opening portion 24Aa) and distance between the semiconductor chip 23 and the frame 24A are also taken as 0.5 mm. Note that description will be made regarding a relation between the distance between the semiconductor chips 22 and 23 and the distance between the frame 24A and the semiconductor chips 22 and 23.

In this way, with the process arranged to dispose the frame 24A and semiconductor chips 22 and 23, the heights from the support members 50 thereof do not strictly have to agree after arrangement. For example, as illustrated in FIG. 4, the semiconductor chips 22 and 23 may be higher than the frame 24A.

Figure 6:
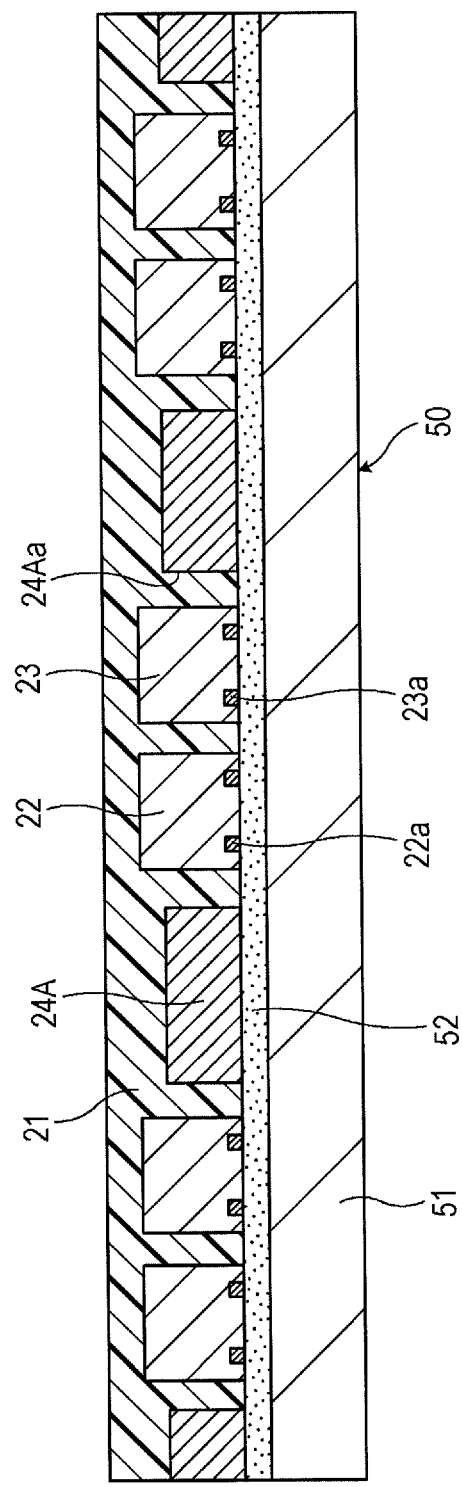
FIG. 6 is an explanatory diagram of a resin disposing process according to the second embodiment.

FIG. 6 is an explanatory diagram of the resin disposing process according to the second embodiment. FIG. 6 schematically illustrates an example of the cross section of the principal portions in a state in which the resin is disposed.

After the frame 24A and semiconductor chips 22 and 23 are disposed and fixed onto the support member 50, the frame 24A and semiconductor chips 22 and 23 are sealed with the resin 21. For example, first, the circumference of the support member 50 is surrounded with a frame or the like, and the resin 21 is poured into the surrounding thereof from above the support member 50 so as to exceed the heights of the semiconductor chips 22 and 23. As for the resin 21, a thermosetting resin such as an epoxy resin or the like is employed. Pouring of the resin 21 may be performed in the air. Also, in order to suppress occurrence of void within the resin 21, pouring of the resin 21 may be performed in vacuum. After pouring the resin 21, the resin 21 is hardened by thermal processing. For example, in the event of employing an epoxy resin as the resin 21, the temperature of the thermal processing is assumed to be 180° C.

Figure 7:
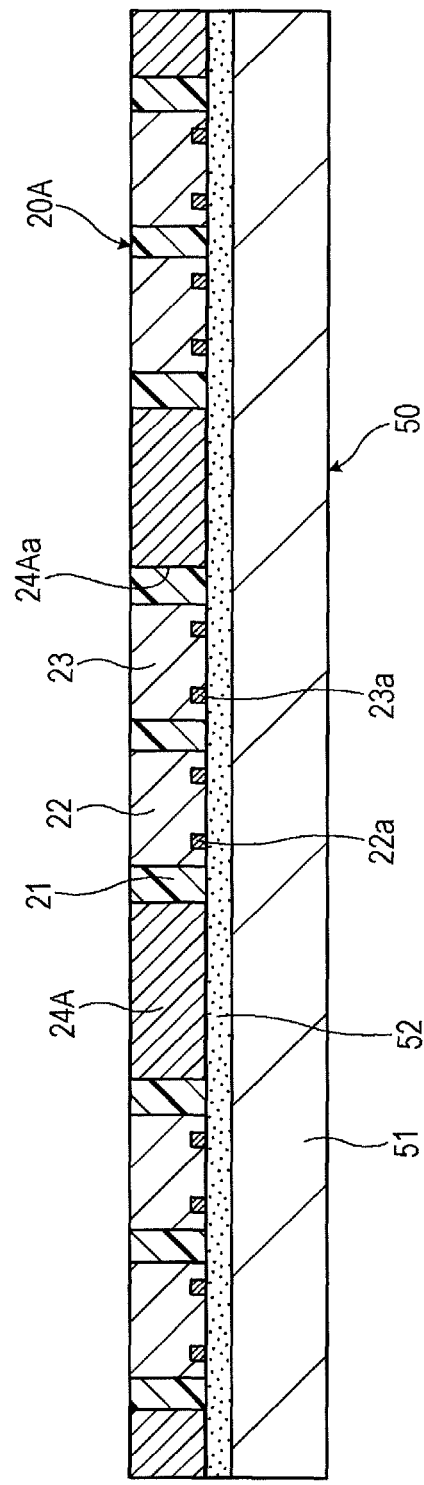
FIG. 7 is an explanatory diagram of a back grinding process according to the second embodiment.

FIG. 7 is an explanatory diagram of a back grinding process according to the second embodiment. FIG. 7 schematically illustrates the cross section of the principal portions in a state in which back grinding has been performed.

After the resin 21 is poured over the support member 50 and is hardened, back grinding is performed to flatten the surface on the formation face side of the resin 21. The amount of back grinding is assumed to be around 100 μm, for example. Back grinding may be performed on not only the resin 21 but also including the semiconductor chips 22 and 23 therein, and further including the frame 24A therein. FIG. 7 exemplifies a case where back grinding has been performed on at least the resin 21 and semiconductor chips 22 and 23 so as to expose the frame 24A and semiconductor chips 22 and 23 from the resin 21 after back grinding. Note that it is desirable for improving thermal dissipation and moisture resistance, and also for alleviating stress due to the resin 21 to align the height of the frame 24A and the heights of the semiconductor chips 22 and 23 in this way.

According to the process so far, a built-in chip substrate (resin mold substrate) 20A is formed on the support member 50.

Figure 8:
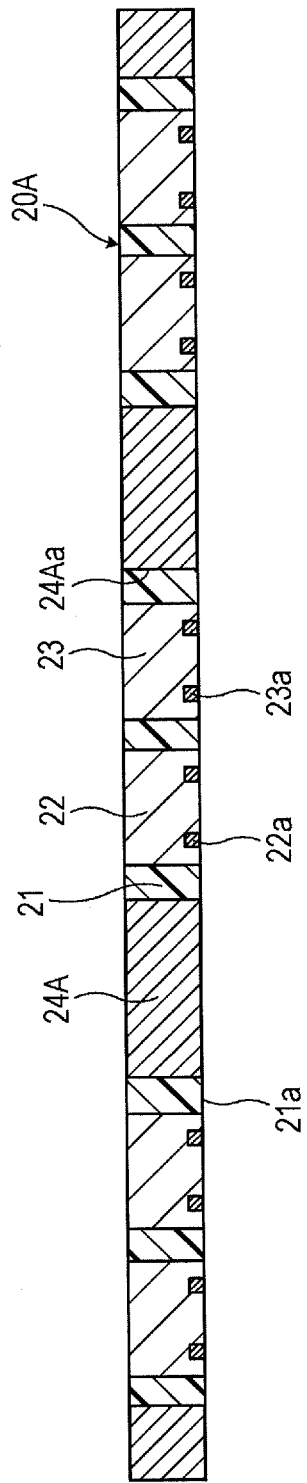
FIG. 8 is an explanatory diagram (Part 1) of a built-in chip substrate separating process according to the second embodiment.
Figure 9:
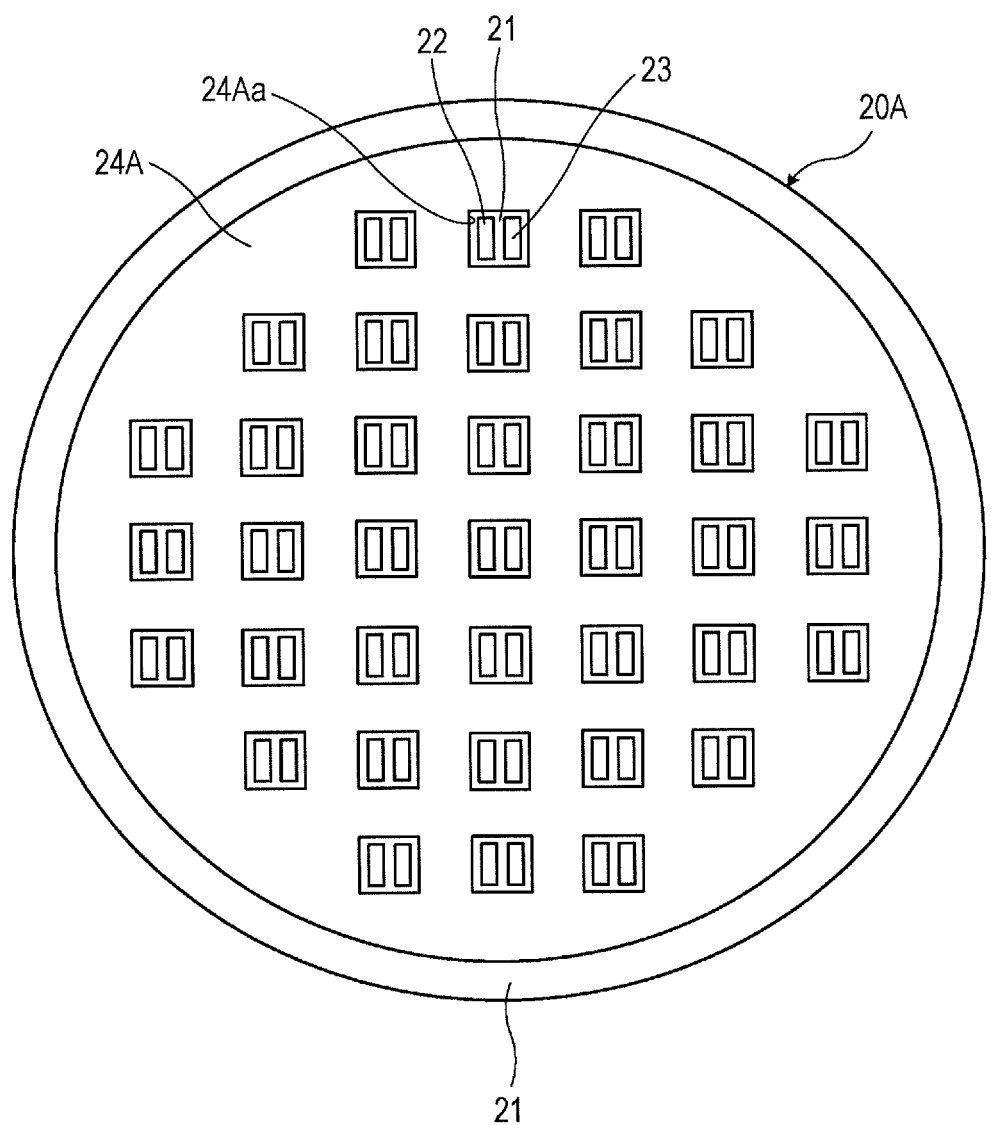
FIG. 9 is an explanatory diagram (Part 2) of the built-in chip substrate separating process according to the second embodiment.

FIGS. 8 and 9 are explanatory diagrams of a built-in chip substrate separation process according to the second embodiment. FIG. 8 schematically illustrates an example of the cross section of the principal portions of the separated built-in chip substrate. FIG. 9 schematically illustrates an example of the plane of the separated built-in chip substrate.

After performing predetermined amount of back grinding, the built-in chip substrate 20A is separated (debonded) from the support member 50. In the event that a thermoplastic resin is employed as the adhesive agent 52, the built-in chip substrate 20A is heated to cure temperature thereof or higher, e.g., 160 through 170° C., and is slid off to be separated from the support member 50. Thus, as illustrated in FIGS. 8 and 9, the built-in chip substrate 20A is obtained wherein the electrode pads 22a of the semiconductor chip 22 and the electrode pads 23a of the semiconductor chip 23 are exposed from the surface 21a (face bonded with the support member 50) of the resin 21.

Figure 10:
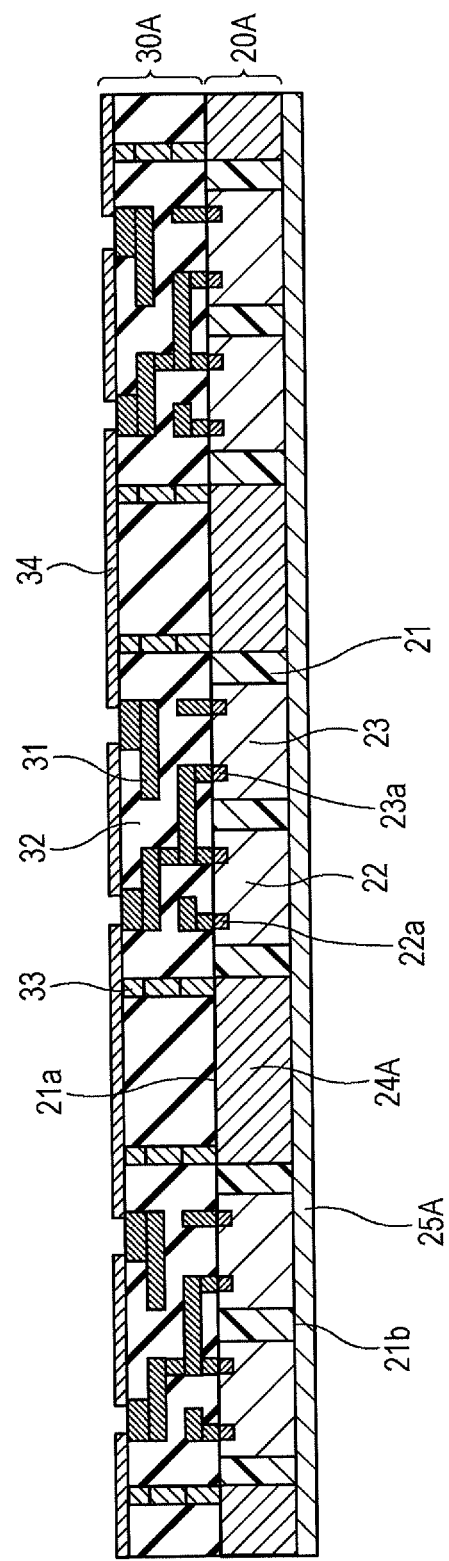
FIG. 10 is an explanatory diagram of a wiring layer and thermal dissipation layer formation process according to the second embodiment.

FIG. 10 is an explanatory diagram of a formation process of the wiring layer and thermal dissipation layer according to the second embodiment. FIG. 10 schematically illustrates the cross section of the principal portions of an example in a state in which the wiring layer and thermal dissipation layer have been formed.

After the built-in chip substrate 20A is separated from the support member 50, of the built-in chip substrate 20A thereof, a wiring layer (rewiring layer) 30A is formed on a surface 21a where the electrode pads 22a and 23a are exposed from the resin 21. The wiring layer 30A is obtained by forming an insulating film and electro-conductive film on the surface 21a, forming the electrode 31 and frame portion 33 within an insulating portion 32 by patterning using the photolithography technique, and further forming a protective film 34 while leaving an external connection pad 31c on the outermost surface.

Note that, as for formation of the insulating portion 32 (insulating film), e.g., in the event that an organic material such as a polyimide resin or the like is employed as a material thereof, an application method may be employed, and in the event that an inorganic material such as SiO or the like is employed, the CVD (Chemical Vapor Deposition) method may be employed. Also, as for formation of the electrode 31 (electro-conductive film) and frame portion 33 (electro-conductive film), in the event that a metal material such as Cu or the like is employed as a material thereof, the spatter method, CVD method, plating method, or the like may be employed.

A thermal dissipation layer 25A is formed on a rear face 21b of the built-in chip substrate 20A separated from the support member 50. The thermal dissipation layer 25A is formed using the spatter method, CVD method, plating method, or the like according to a material thereof. Note that formation of the thermal dissipation layer 25A may be performed after formation of the wiring layer 30A or before formation of the wiring layer 30A.

Figure 11:
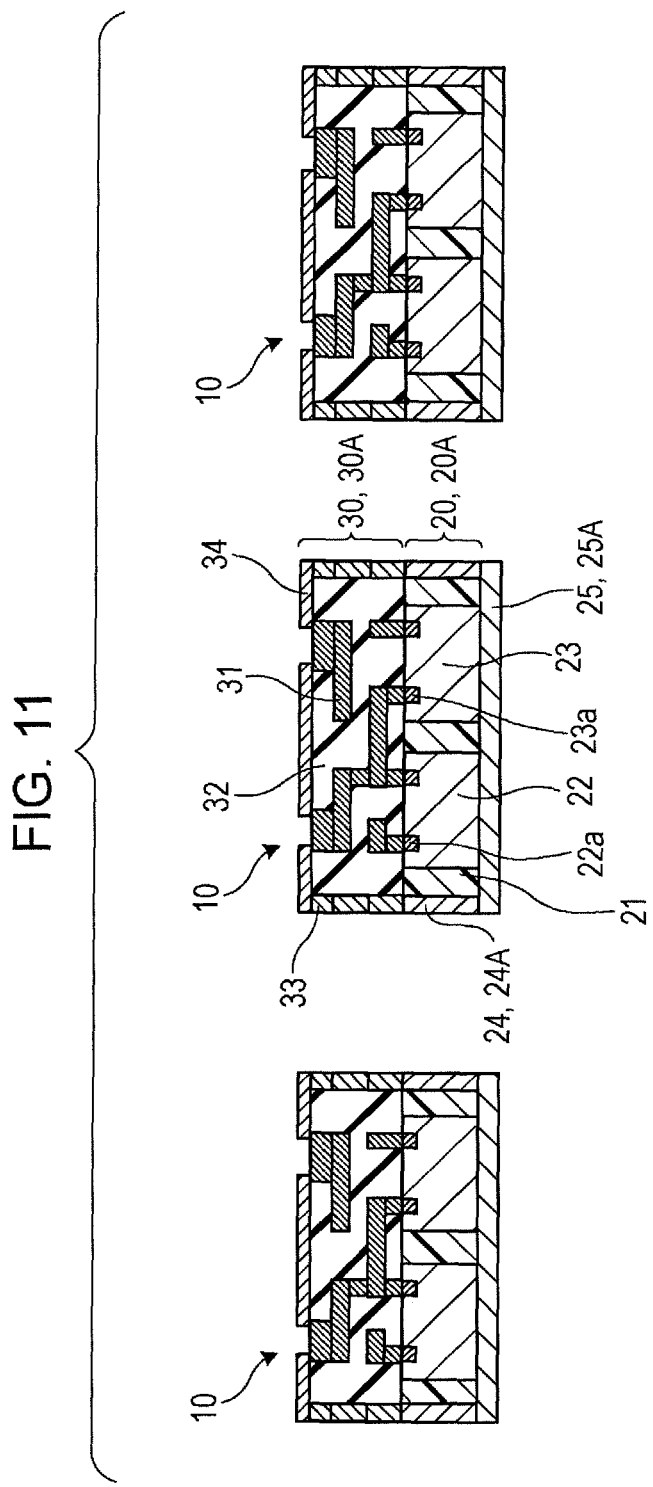
FIG. 11 is an explanatory diagram of a dicing process according to the second embodiment.

FIG. 11 is an explanatory diagram of a dicing process according to the second embodiment. FIG. 11 schematically illustrates an example of the cross section in a state in which dicing has been performed.

After formation of the wiring layer 30A and thermal dissipation layer 25A, the wiring layer 30A, built-in chip substrate 20A, and thermal dissipation layer 25A are cut at a predetermined position using a dicing saw to be fragment into individual semiconductor devices 10 (MCP). At the time of fragmenting, the frame 24A of the above one plate is cut, and cutting by a dicing saw is performed so that the frame 24 which surrounds the semiconductor chips 22 and 23 within each of the semiconductor devices 10 remains. Thus, as illustrated in FIG. 11, each of the semiconductor devices 10 is obtained wherein the wiring layer 30 (wiring layer 30A) including the frame portion 33 is formed on the built-in chip substrate 20 (built-in chip substrate 20A) including the frame 24 (frame 24A) and thermal dissipation layer 25 (thermal dissipation layer 25A).

With the semiconductor devices 10 thus obtained, improvement of 15% in thermal dissipation efficiency has been confirmed, and yield improvement of 20% in a high-temperature high-humidity reliability test has been confirmed, as compared to a semiconductor device formed without providing the frame 24, thermal dissipation layer 25, and frame portion 33.

Note that, with the process described as the second embodiment, after pouring the resin 21 over the support member 50 where the frame 24A and semiconductor chips 22 and 23 are disposed as illustrated in FIG. 6, the extra resin 21 may be removed using a squeegee or the like.

For example, the squeegee is moved in parallel as to the support member 50 in accordance with the heights of the semiconductor chips 22 and 23 illustrated in FIG. 6, and accordingly, the extra resin 21 higher than the semiconductor chips 22 and 23 is removed. That is to say, according to parallel movement of the squeegee, the extra resin 21 higher than the semiconductor chips 22 and 23 is pushed out from above the support member 50 and is removed.

Also, in the event that the heights of the semiconductor chips 22 and 23 and frame 24A are aligned beforehand, the extra resin 21 higher than the semiconductor chips 22 and 23 and frame 24A is removed. In the event that the frame 24A is higher than the semiconductor chips 22 and 23, the extra resin 21 higher than the frame 24A is removed. In these cases, the resins 21 poured in a different opening 24Aa are separated.

After the extra resin 21 is thus removed, in the same way as described above, thermal processing is performed with predetermined temperature to harden the resin 21.

Also, in the event that the heights of the semiconductor chips 22 and 23 and frame 24A are aligned beforehand, the extra resin 21 is removed using the squeegee or the like, and the back grinding process described in FIG. 7 may be omitted. In the event that the frame 24A is higher than the semiconductor chips 22 and 23, and also in the event that the resin 21 remains on the rear faces of the semiconductor chips 22 and 23, in the same way, the extra resin 21 higher than the frame 24A is removed, and the back grinding process described in FIG. 7 may be omitted.

Also, at the time of pouring the resin 21, in addition to a method for pouring over the entire support member 50, there may be employed a method for pouring the resin 21 to each of the openings 24Aa of the frame 24 using a dispenser or the like.

According to the process so far, the semiconductor device 10 which exhibits high thermal dissipation and moisture resistance is formed by further providing the frame 24, thermal dissipation layer 25 and frame portion 33.

Incidentally, a semiconductor device (MCP) where the frame 24 is not provided to the built-in chip substrate 20 like this semiconductor device 10 is formed in the following flow, for example. Specifically, with a support member where an adhesive agent is applied, the electrode pad faces of multiple semiconductor chips are disposed facing the adhesive agent side, a frame surrounding all of the semiconductor chips is provided for example, and a resin is poured into the frame thereof. After hardening the poured resin, in order to form a wiring layer (rewiring layer) on the electrode pad sides of the multiple semiconductor chips, a built-in chip substrate is separated from the support member. Thus, as illustrated in FIGS. 12 and 13 for example, a built-in chip substrate 200 where a semiconductor chip 202 and a semiconductor chip 203 are provided within a resin 201 is obtained.

Figure 12:
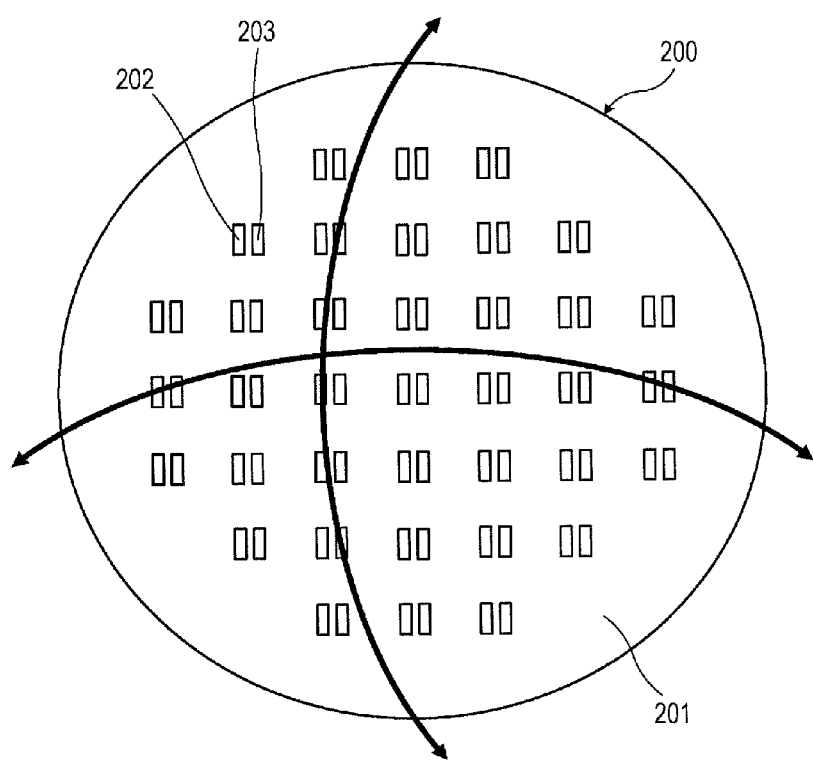
FIG. 12 is a diagram (Part 1) illustrating an example of a built-in chip substrate in another mode.
Figure 13:
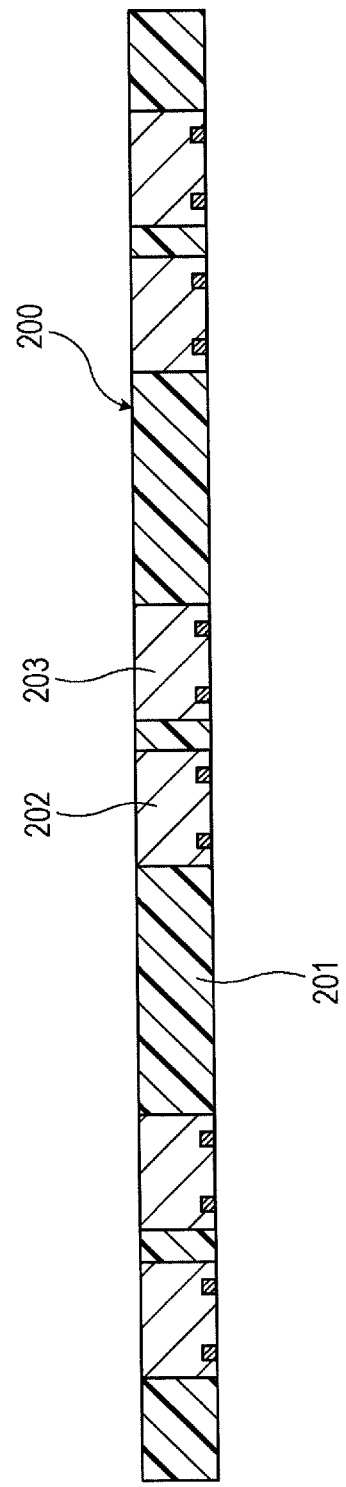
FIG. 13 is a diagram (Part 2) illustrating an example of a built-in chip substrate in another mode.

However, at the time of separating the built-in chip substrate 200 being separated from the support member in this way, according to stress caused due to the previous cure shrinkage of the resin 201 thereof, warpage or shrinkage such as illustrated in a arrow in FIG. 12 may occur on the built-in chip substrate 200 separated from the support member.

Figure 14:
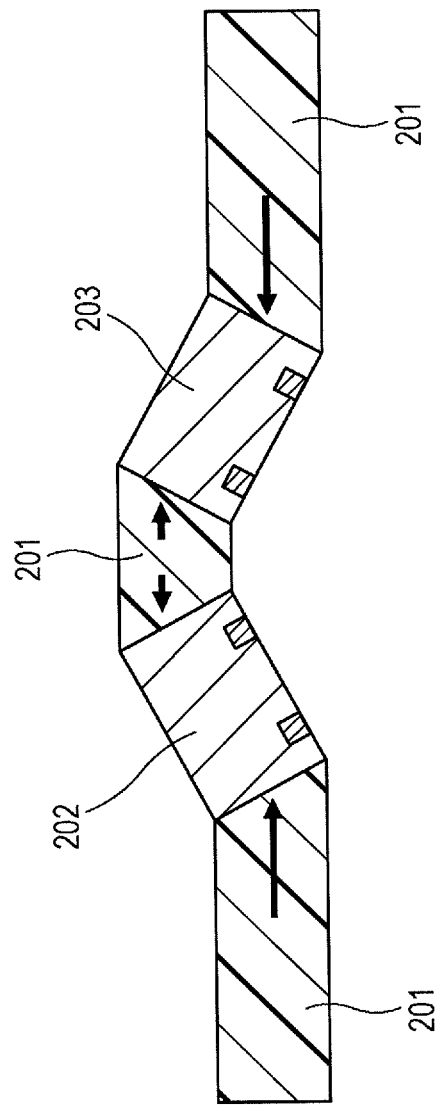
FIG. 14 is a diagram illustrating inclination of a semiconductor chip in the built-in chip substrate in another mode.

Also, with the subsequent wiring layer formation (rewiring) process thereof, thermal processing may be performed for formation of an insulating film or electro-conductive film. In this case, due to difference of the thermal expansion ratios between the semiconductor chips 202 and 203 and the resin 201, warpage or shrinkage may occur on the built-in chip substrate 200 in the same way. Further, according to influence of stress due to difference of the amount of the resin 201 between the semiconductor chips 202 and 203, and the amount of the resin 201 in the circumference of the semiconductor chips 202 and 203, as illustrated in FIG. 14, the semiconductor chips 202 and 203 within the resin 201 may be inclined. Note that FIG. 14 schematically illustrates a stress level due to difference in the amount of the resin 201 using an arrow.

Though the photolithography technique is used for formation of a rewiring layer, in the event that the built-in chip substrate 200 includes warpage, and the semiconductor chips 202 and 203 have inclination, the pattern of a wiring or the like to be projected on the built-in chip substrate 200 becomes blurred, and accordingly, it may be difficult to perform patterning with high precision. In particular, the inclinations of the semiconductor chips 202 and 203 becomes great hindrance for forming a wiring (inter-chip wiring) which electrically connects between these. In the event that a vacuum absorption method is employed for handling of the built-in chip substrate 200, when warpage occurs on the built-in chip substrate 200, poor absorption occurs, this may cause the built-in chip substrate 200 to fall during handling. Shrinkage of the built-in chip substrate 200 also becomes a great value in a 6 through 12-inch substrate, and this may cause alignment with a photo mask to be difficult.

On the other hand, with the above semiconductor device 10, within the resin 21 of the built-in chip substrate 20A to be used for formation thereof, in addition to the semiconductor chips 22 and 23, a frame 24A is provided, and each of the semiconductor chips 22 and 23 is disposed on the opening 24Aa of the frame 24A thereof. In this way, the frame 24A is provided within the resin 21 of the built-in chip substrate 20A, and accordingly, the amount of the resin 21 is reduced, and further, the frame 24 serves as a role for maintaining the shape of the built-in chip substrate 20A against stress due to the resin 21. Thus, warpage of the built-in chip substrate 20A, and inclination of the semiconductor chips 22 and 23 are effectively suppressed. As a result thereof, the electrode 31 of the wiring layer (rewiring layer) 30 formed on the built-in chip substrate 20A may be subjected to patterning with high precision.

According to the above built-in chip substrate 20A, there may be realized the semiconductor device 10 which includes the wiring layer 30 including the electrode 31 subjected to patterning with high precision, and so forth, and excels in thermal dissipation and moisture resistance.

Figure 15:
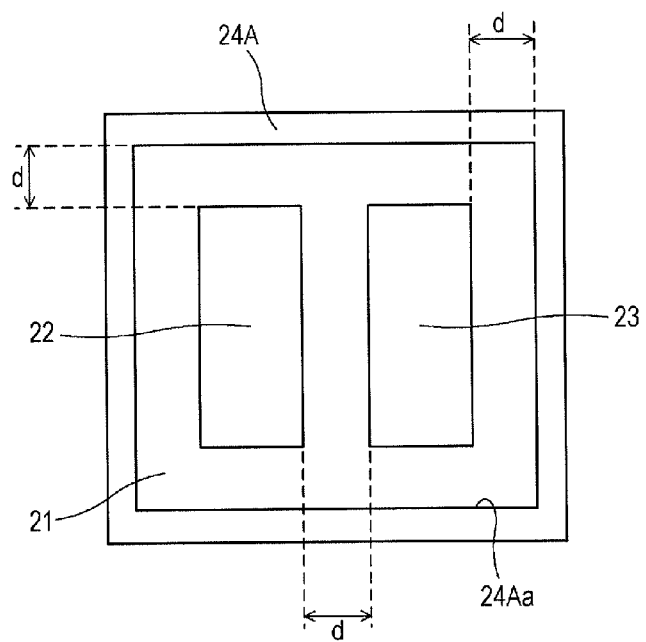
FIG. 15 is a diagram illustrating an arrangement example of semiconductor chips.

Note that, in the event of providing the frame 24A like the above built-in chip substrate 20A, it is desirable to dispose the semiconductor chips 22 and 23 within the opening 24Aa as illustrated in the next FIG. 15, for example.

FIG. 15 is a diagram illustrating an arrangement example of the semiconductor chips. FIG. 15 schematically illustrates the plane of an area including one set of the semiconductor chips 22 and 23 of the built-in chip substrate 20A, and a portion of the resin 21 and frame 24A in the circumference thereof.

The arrangement of the semiconductor chips 22 and 23 are desirable so that any of distance between the semiconductor chips 22 and 23, distance between the semiconductor chip 22 and the frame 24A, and distance between the semiconductor chip 23 and the frame 24A is equal to distance d. Alternatively, the semiconductor chips 22 and 23 and frame 24A are disposed so that those distances are the same or approximated value.

According to such an arrangement, stress (imbalance of stress) caused due to the resin 21 between the semiconductor chips 22 and 23, the resin 21 between the semiconductor chip 22 and the frame 24A, and the resin 21 between the semiconductor chip 23 and the frame 24A is relieved. As a result thereof, the inclinations of the semiconductor chips 22 and 23 due to the resin 21 may be suppressed more effectively.

Note that, in the event that three or more semiconductor chips are disposed on the opening 24Aa of the frame 24A as well, stress as described above may be relieved and inclinations of the semiconductor chips may be suppressed by suitably adjusting distance between the semiconductor chips, and distance between each of the semiconductor chips and the frame 24A.

The semiconductor device 10 thus formed may be mounted on another electronic part such as a circuit substrate or the like using the external connection pad 31c.

Figure 16:
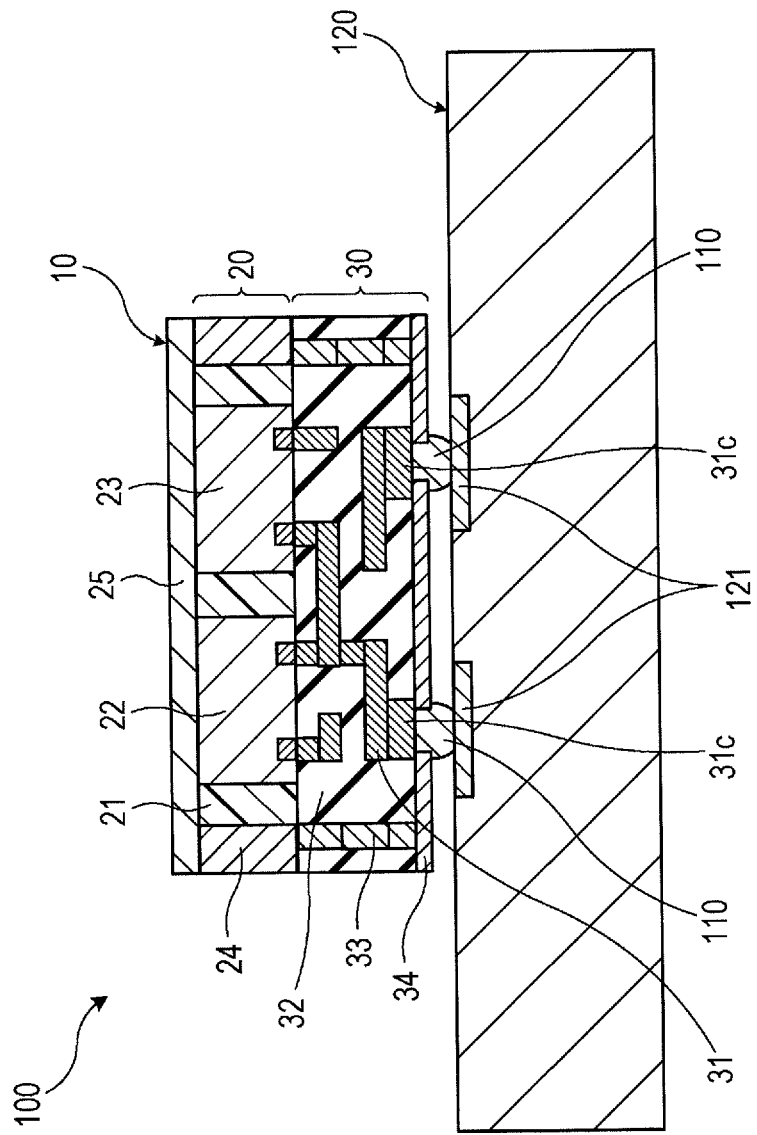
FIG. 16 is a diagram illustrating a configuration example of an electronic device.

FIG. 16 is a diagram illustrating a configuration example of an electronic device. FIG. 16 schematically illustrates the cross section of an example of the electronic device.

An electronic device 100 illustrated in FIG. 16 includes an electronic part 120, and a semiconductor device 10 mounted on the electronic part 120. The electronic part 120 may be applied to another MCP or the like in addition to circuit substrates. For example, a bump (external connection terminal), e.g., a solder ball 110 is provided to the external connection pad 31c provided so as to be exposed from the protective film 34, the semiconductor device 10 is electrically connected to a predetermined connection pad 121 provided to the electronic part 120 via the solder ball 110 thereof.

The electronic device 100 including the wiring layer 30 formed with high precision and the semiconductor device 10 which excels in thermal dissipation and moisture resistance is realized.

Next, a third embodiment will be described. Explanatory diagrams of the processes of a semiconductor device formation method according to the third embodiment will be illustrated in FIGS. 17 through 24. Hereafter, the processes will sequentially be described. Now, with a configuration wherein two semiconductor chips are included in one semiconductor device being taken as an example, a formation method thereof will be described.

Figure 17:
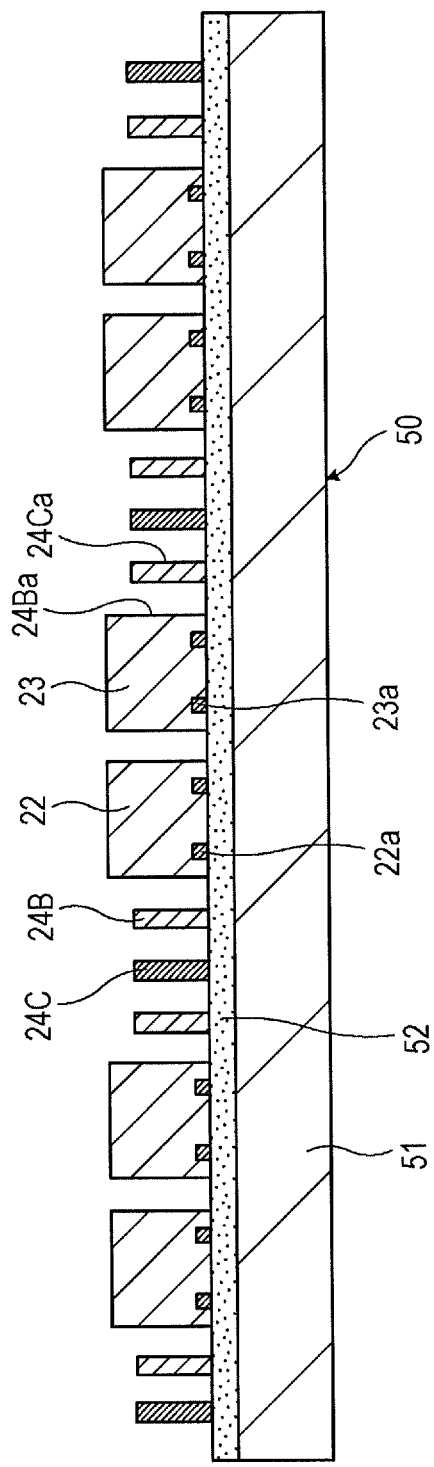
FIG. 17 is an explanatory diagram (Part 1) of an arrangement process of a frame and semiconductor chip according to a third embodiment.
Figure 18:
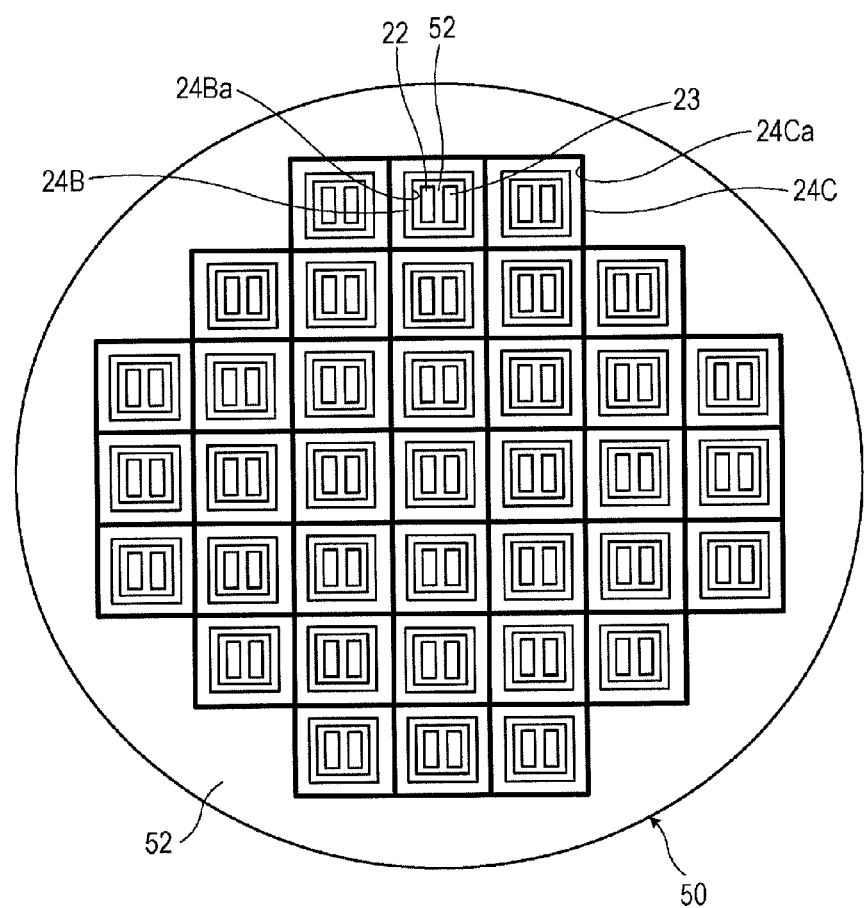
FIG. 18 is an explanatory diagram (Part 2) of the arrangement process of a frame and semiconductor chip according to the third embodiment.

FIGS. 17 and 18 are explanatory diagrams of an arrangement process of a frame and semiconductor chips according to the third embodiment. FIG. 17 schematically illustrates an example of the cross section of the principal portions in a state in which the frame and semiconductor chips are disposed. FIG. 18 schematically illustrates an example of the plane in a state in which the frame and semiconductor chips are disposed.

First, in the same way as with the above FIG. 3, the support member 50 where the adhesive agent 52 is provided onto the support substrate 51, is prepared. After preparing the support member 50, each of a frame 24B and a frame 24C, and semiconductor chips 22 and 23 is disposed in a predetermined position on the face where the adhesive agent 52 of the support member 50 is provided.

The frame 24B is prepared one at a time regarding the semiconductor chips 22 and 23 of each set, and includes an opening 24Ba where the semiconductor chips 22 and 23 of one set are disposed on the inner side. The frame 24B principally has a function to suppress the semiconductor chips 22 and 23 from inclining at the time of formation of a later-described built-in chip substrate 20B, and a function to improve thermal dissipation and moisture resistance of each of the semiconductor devices 10 obtained after dicing.

The frame 24C has a grid shape having an opening 24Ca where the semiconductor chips 22 and 23 of each set and the frame 24B surrounding these are disposed in the inner side. The frame 24C principally has a function to suppress warpage from occurring on a later-described built-in chip substrate 20B at the time of formation of the built-in chip substrate 20B thereof.

For example, these frame 24B and frame 24C are disposed on the adhesive agent 52 of the support member 50, and the electro pads 22a of the semiconductor chip 22 and the electro pads 23a of the semiconductor chip 23 are disposed on each opening 24Ba of the frame 24B, facing the adhesive agent 52 side. The frame 24B and frame 24C, and semiconductor chips 22 and 23 are adhesively fixed onto the support member 50 by the adhesive agent 52.

Note that, as for the semiconductor chips 22 and 23, semiconductor chips with a size of 5-mm length×3-mm width× 0.6-mm thickness is employed, for example. As for the frame 24B, a frame made from Cu with an outer size of 10-mm length×11.5-mm width×0.5 through 0.6-mm thickness is employed wherein the opening 24Ba with 6-mm length×7.5-mm width is provided, for example. As for the frame 24C, a frame made from Cu with 0.5 through 0.6-mm thickness is employed wherein the opening 24Ca with 12-mm length× 13.5-mm width is provided, for example. The frame 24B is disposed with an interval of 2 mm from the frame 24C on the inner side of the openings 24Ca of such a frame 24C. The semiconductor chips 22 and 23 are disposed with an interval of 0.5 mm on the inner side of the openings 24Ba of the frame 24B thereof assuming that distance between the semiconductor chip 22 and the frame 24B, and distance between the semiconductor chip 23 and the frame 24B are taken as 0.5 mm. The semiconductor chips 22 and 23 may effectively be suppressed from being inclined due to stress caused by the resin 21 at the time of forming a later-described built-in chip substrate 20B by disposing between the frame 24B and the semiconductor chips 22 and 23 in such a way.

As for the arrangement of the semiconductor chips 22 and 23, a die bonder is employed, for example. The arrangement precision of the semiconductor chips 22 and 23 may be improved by first disposing the frames 24B and 24C on the support member 50, and then disposing the semiconductor chips 22 and 23 based on the position information of the disposed frame 24B and frame 24C.

With a process arranged to dispose the frames 24B and 24C and semiconductor chips 22 and 23, heights thereof do not necessarily have to strictly agree. For example, as illustrated in FIG. 17, the semiconductor chips 22 and 23 may be higher than the frames 24B and 24C.

Figure 19:
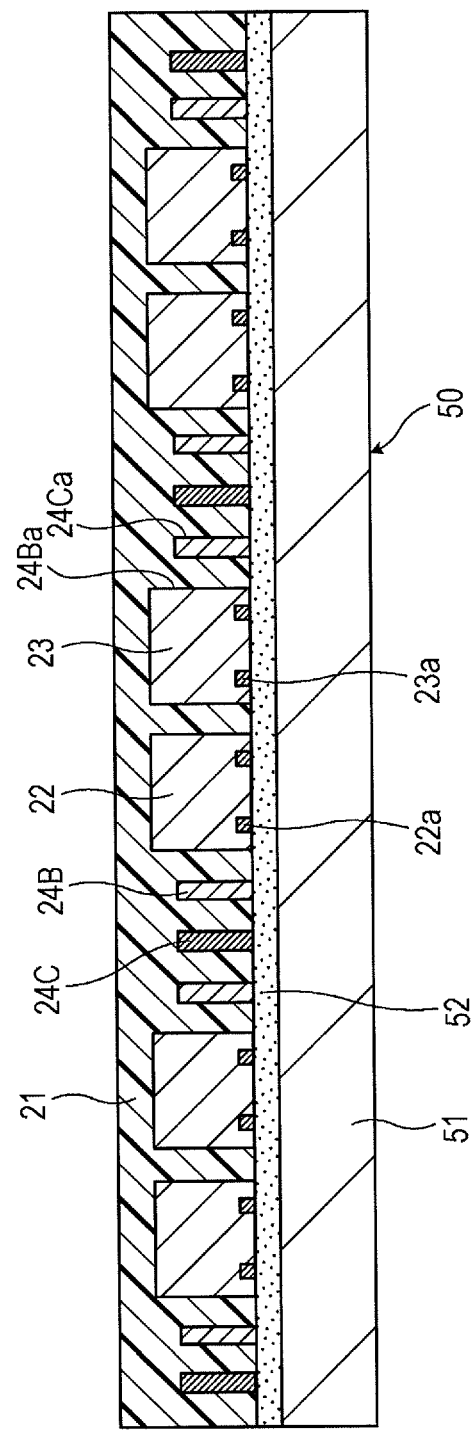
FIG. 19 is an explanatory diagram of a resin disposing process according to the third embodiment.

FIG. 19 is an explanatory diagram of a resin disposing process according to the third embodiment. FIG. 19 schematically illustrates an example of the cross section of the principal portions in a state in which the resin is disposed.

After disposing and fixing the frames 24B and 24C and semiconductor chips 22 and 23 on the support member 50, the frames 24B and 24C and semiconductor chips 22 and 23 are sealed with the resin 21. For example, first, the circumference of the support member 50 is surrounded with a frame or the like, and the resin 21 is poured into the surrounding thereof from above the support member 50 so as to exceed the heights of the semiconductor chips 22 and 23. Pouring of the resin 21 is performed in the air or in a vacuum. As for the resin 21, an epoxy resin or the like is employed. After pouring the resin 21, the resin 21 is hardened by thermal processing.

Figure 20:
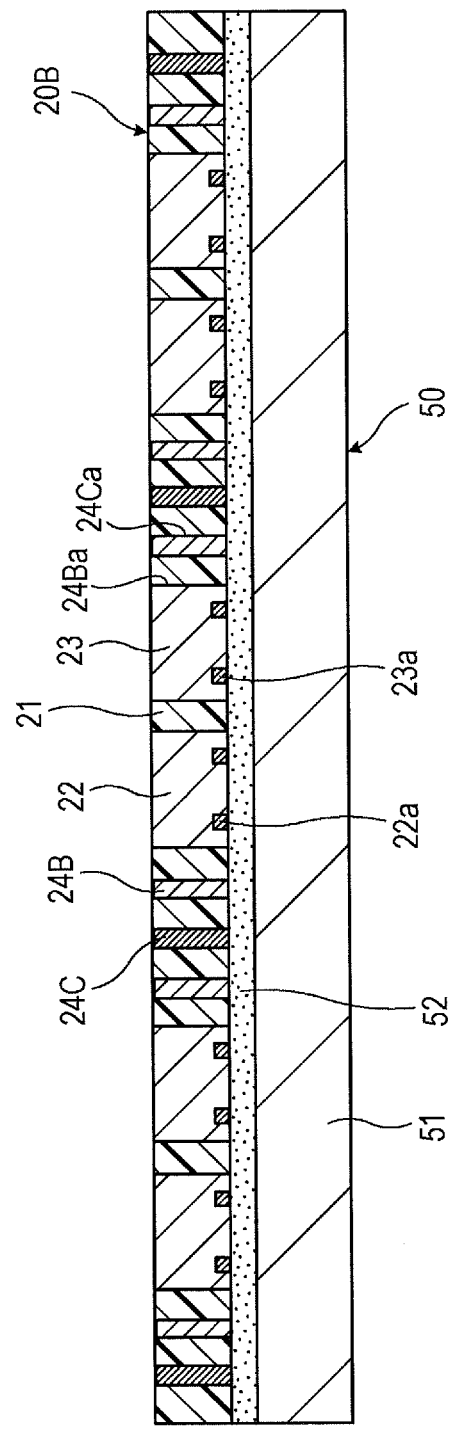
FIG. 20 is an explanatory diagram of a back grinding process according to the third embodiment.

FIG. 20 is an explanatory diagram of a back grinding process according to the third embodiment. FIG. 20 schematically illustrates the cross section of the principal portions in a state in which back grinding has been performed.

After the resin 21 is poured over the support member 50 and is hardened, back grinding is performed to flatten the surface on the formation face side of the resin 21. The amount of back grinding is assumed to be around 100 µm, for example. Back grinding may be performed on not only the resin 21 but also including the semiconductor chips 22 and 23 therein, and further including the frames 24B and 24C therein. FIG. 20 exemplifies a case where back grinding has been performed on at least the resin 21 and semiconductor chips 22 and 23 so as to expose the frames 24B and 24C, and semiconductor chips 22 and 23 from the resin 21. Note that it is desirable for improving thermal dissipation and moisture resistance, and also for alleviating stress due to the resin 21 to align the heights of the frame 24Ba and 24C and the heights of the semiconductor chips 22 and 23 in this way.

According to the process so far, a built-in chip substrate (resin mold substrate) 20B is formed on the support member 50.

Figure 21:
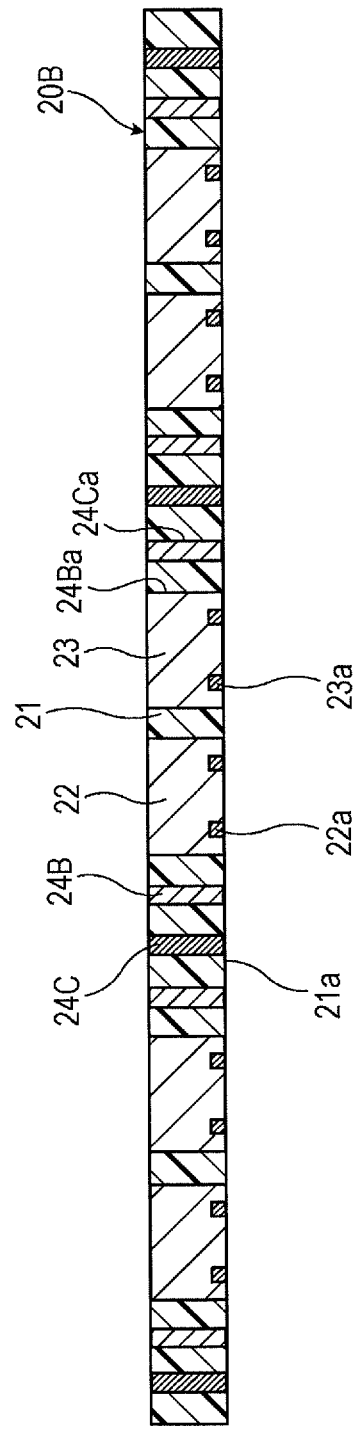
FIG. 21 is an explanatory diagram (Part 1) of a built-in chip substrate separating process according to the third embodiment.
Figure 22:
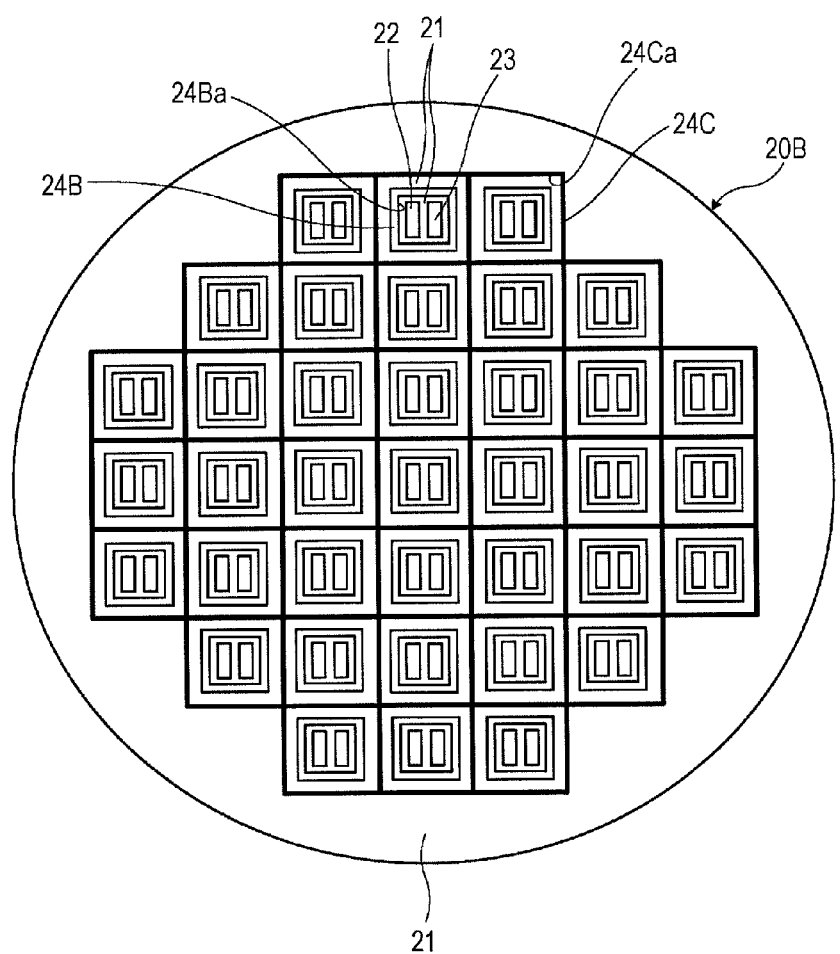
FIG. 22 is an explanatory diagram (Part 2) of the built-in chip substrate separating process according to the third embodiment.

FIGS. 21 and 22 are explanatory diagrams of a built-in chip substrate separation process according to the third embodiment. FIG. 21 schematically illustrates an example of the cross section of the principal portions of the separated built-in chip substrate. FIG. 22 schematically illustrates an example of the plane of the separated built-in chip substrate.

After performing predetermined amount of back grinding, the built-in chip substrate 20B is separated from the support member 50. In the event that a thermoplastic resin is employed as the adhesive agent 52, the built-in chip substrate 20B is heated to cure temperature thereof or higher, and is slid off to be separated from the support member 50. Thus, as illustrated in FIGS. 21 and 22, the built-in chip substrate 20B is obtained wherein the electrode pads 22a of the semiconductor chip 22 and the electrode pads 23a of the semiconductor chip 23 are exposed from the surface 21a of the resin 21.

With the built-in chip substrate 20B, the grid-shaped frame 24C is provided along with the frame 24B, and accordingly, occurrence of warpage of the built-in chip substrate 20B thereof is effectively suppressed. As an example, the warpage of the built-in chip substrate 20B of which the diameter was 8 inch (around 200 mm) separated from the support member 50 is around 3 µm. On the other hand, the warpage of the built-in chip substrate formed in the same flow without providing the frames 24B and 24C within the resin 21 was around 200 µm. The warpage of the built-in chip substrate 20B to be obtained after separation from the support member 50 may effectively be suppressed by providing the frames 24B and 24C within the resin 21.

Figure 23:
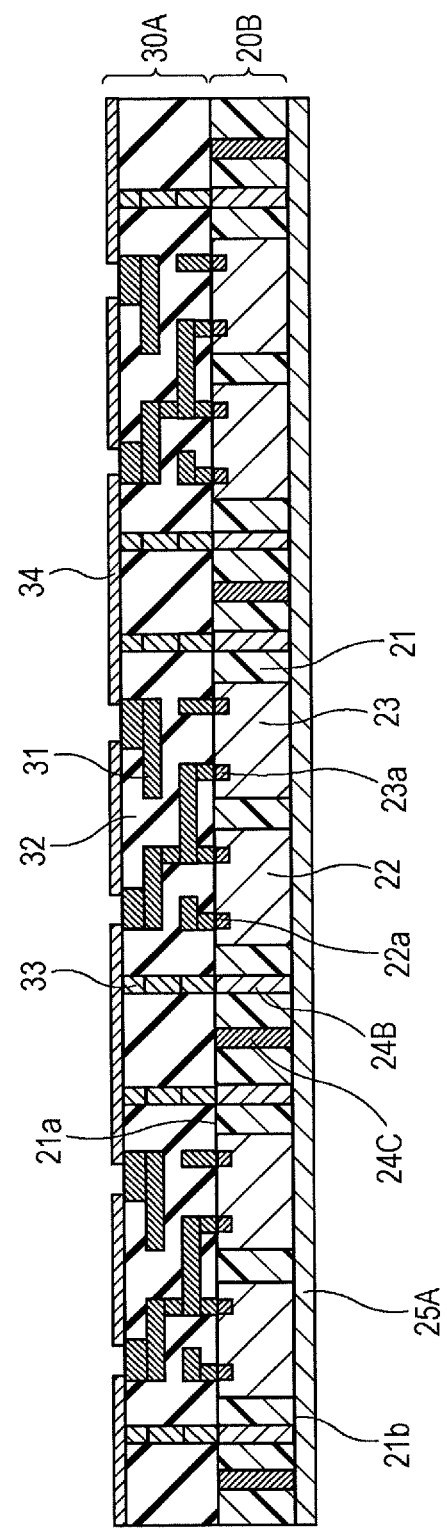
FIG. 23 is an explanatory diagram of a wiring layer and thermal dissipation layer formation process according to the third embodiment.

FIG. 23 is an explanatory diagram of a formation process of the wiring layer and thermal dissipation layer according to the third embodiment. FIG. 23 schematically illustrates the cross section of the principal portions of an example in a state in which the wiring layer and thermal dissipation layer have been formed.

After the built-in chip substrate 20B is separated from the support member 50, of the built-in chip substrate 20B thereof, a wiring layer (rewiring layer) 30A is formed on a surface 21a where the electrode pads 22a and 23a are exposed from the resin 21. The wiring layer 30A is obtained by forming an insulating film and electro-conductive film on the surface 21a, forming the electrode 31 and frame portion 33 within an insulating portion 32 by patterning using the photolithography technique, and further forming a protective film 34 while leaving an external connection pad 31c on the outermost surface.

A thermal dissipation layer 25A is formed on a rear face 21b of the built-in chip substrate 20B separated from the support member 50. Note that formation of the thermal dissipation layer 25A may be performed after formation of the wiring layer 30A or before formation of the wiring layer 30A.

With the built-in chip substrate 20B, the frames 24B and 24C are provided within the resin 21, and accordingly, the warpage of the built-in chip substrate 20B and the inclinations of the semiconductor chips 22 and 23 are effectively be suppressed. With the built-in chip substrate 20B, it was confirmed that relatively fine inter-chip wiring may be performed on the wiring layer 30A, such as equal to or smaller than 3 µm. On the other hand, with a built-in chip substrate formed in the same flow without providing the frames 24B and 24C within the resin 21, an exposure obstacle due to the inclinations of the semiconductor chips 22 and 23 occurred, and inter-chip wiring less than 10 µm was not formed. The built-in chip substrate 20B may be obtained by providing the frames 24B and 24C within the resin 21 wherein the wiring layer 30A including an electrode 31 subjected to patterning with high precision, and so forth is formed within the insulating portion 32.

Figure 24:
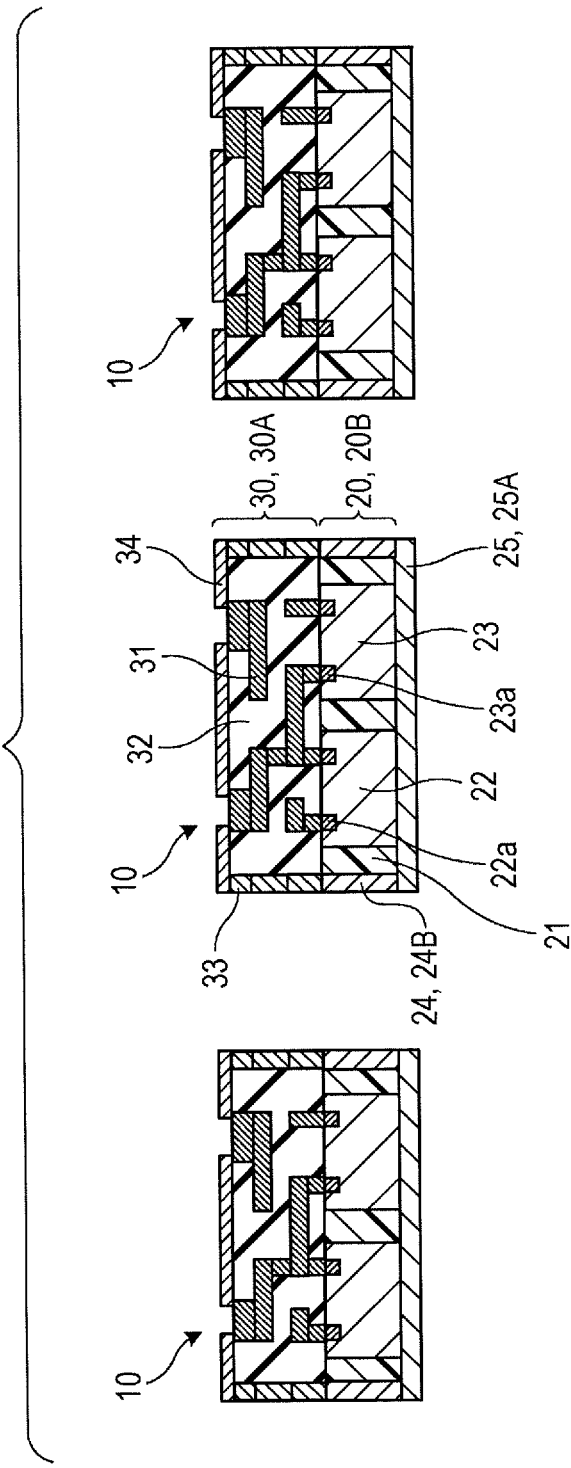
FIG. 24 is an explanatory diagram of a dicing process according to the third embodiment.

FIG. 24 is an explanatory diagram of a dicing process according to the third embodiment. FIG. 24 schematically illustrates an example of the cross section in a state in which dicing has been performed.

After formation of the wiring layer 30A and thermal dissipation layer 25A, the wiring layer 30A, built-in chip substrate 20A, and thermal dissipation layer 25A are cut at a predetermined position using a dicing saw to be fragment into individual semiconductor devices 10 (MCP). At the time of fragmenting, cutting by a dicing saw is performed so that the above frame 24B remains as the frame 24 which surrounds the semiconductor chips 22 and 23 within each of the semiconductor devices 10. Thus, as illustrated in FIG. 24, each of the semiconductor devices 10 is obtained wherein the wiring layer 30 (wiring layer 30A) including the frame portion 33 is formed on the built-in chip substrate 20 (built-in chip substrate 20B) including the frame 24 (frame 24B) and thermal dissipation layer 25 (thermal dissipation layer 25A).

With the semiconductor devices 10 thus obtained, improvement of 15% in thermal dissipation efficiency has been confirmed, and yield improvement of 20% in a high-temperature high-humidity reliability test has been confirmed, as compared to a semiconductor device formed without providing the frame 24, thermal dissipation layer 25, and frame portion 33. Also, with the semiconductor devices 10, in the event of forming the semiconductor devices by providing the frame 24 and thermal dissipation layer 25 without providing the frame portion 33, improvement of 15% in thermal dissipation efficiency has been confirmed, and yield improvement of 8% in a high-temperature high-humidity reliability test has been confirmed, as compared to a semiconductor device formed without providing the frame 24, thermal dissipation layer 25, and frame portion 33.

Note that, with the process described as the third embodiment, after pouring the resin 21 over the support member 50 where the frames 24B and 24C, and semiconductor chips 22 and 23 are disposed as illustrated in FIG. 19, the extra resin 21 may be removed using squeegee or the like.

For example, the squeegee may be used to remove the extra resin 21 higher than the semiconductor chips 22 and 23. Additionally, in the event that the heights of the frames 24B and 24C and semiconductor chips 22 and 23 are aligned beforehand, the extra resin 21 higher than these may be removed. In the event that the frames 24B and 24C are higher than the semiconductor chips 22 and 23, the extra resin 21 higher than the frames 24B and 24C may be removed.

Also, in the event that the heights of the frames 24B and 24C and semiconductor chips 22 and 23 are aligned beforehand, the extra resin 21 is removed using the squeegee or the like, and the back grinding process (FIG. 20) may be omitted. In the event that the frames 24B and 24C are higher than the semiconductor chips 22 and 23, and also in the event that the resin 21 remains on the rear faces of the semiconductor chips 22 and 23, the extra resin 21 higher than the frames 24B and 24C is removed, and the back grinding process (FIG. 20) may be omitted.

Also, at the time of pouring the resin 21, in addition to a method for pouring over the entire support member 50, there may be employed a method for pouring the resin 21 to each of the openings 24Ba of the frame 24B and the openings 24Ca of the frame 24C using a dispenser or the like.

According to the process so far, the built-in chip substrate 20B including the wiring layer 30 including the electrode 31 subjected to patterning with high precision may be realized. Further, the semiconductor device 10 which includes the wiring layer 30 formed with high precision and excels in thermal dissipation of heat and moisture resistance may be realized.

Note that, with the above example, the grid-shaped frame has been employed as the frame 24C which principally suppresses the warpage of the built-in chip substrate 20B, but the shape of the frame 24C is not restricted to such a grid-shaped frame.

FIGS. 25 through 28 are diagrams illustrating another example according to the third embodiment. FIGS. 25 through 28 schematically illustrate the plane of an example of a built-in chip substrate where a frame is provided.

Figure 25:
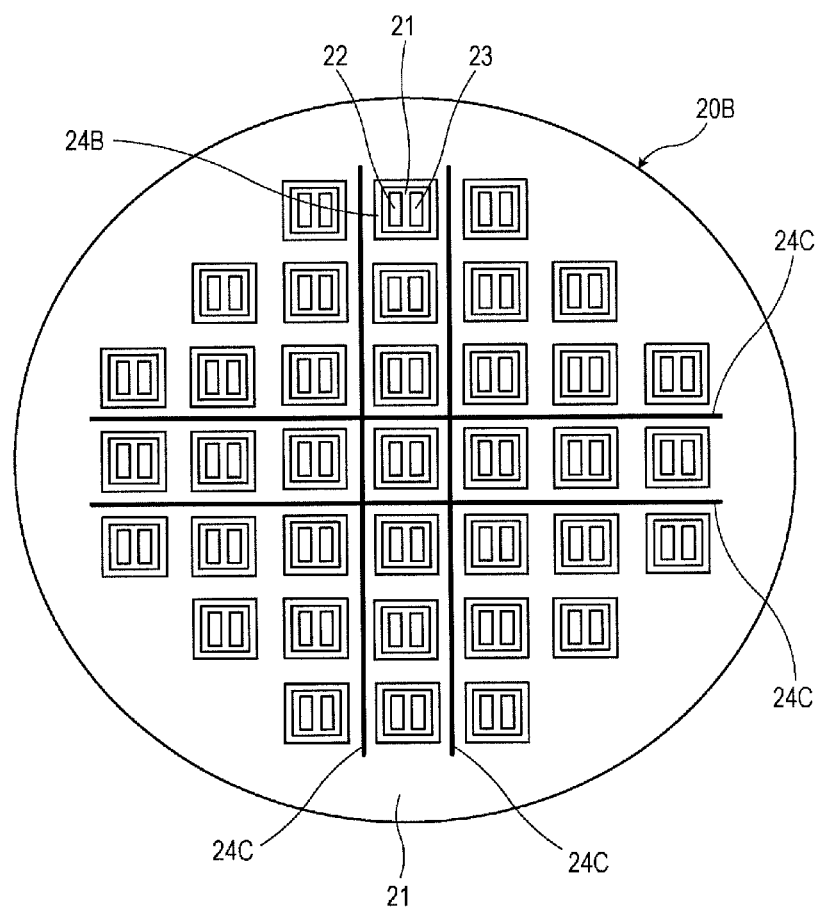
FIG. 25 is a diagram (Part 1) illustrating another example of a frame according to the third embodiment.

As for the frame 24C to be provided within the resin 21 of the built-in chip substrate 20B, as illustrated in FIG. 25, there may be employed a pair of frames (reinforcing member) extending in parallel which are disposed in the vertical direction and horizontal direction so as to sandwich the frames 24B disposed at the center in parallel, respectively. Even in the event of employing such a frame 24C, the warpage of the built-in chip substrate 20B may be suppressed.

Figure 26:
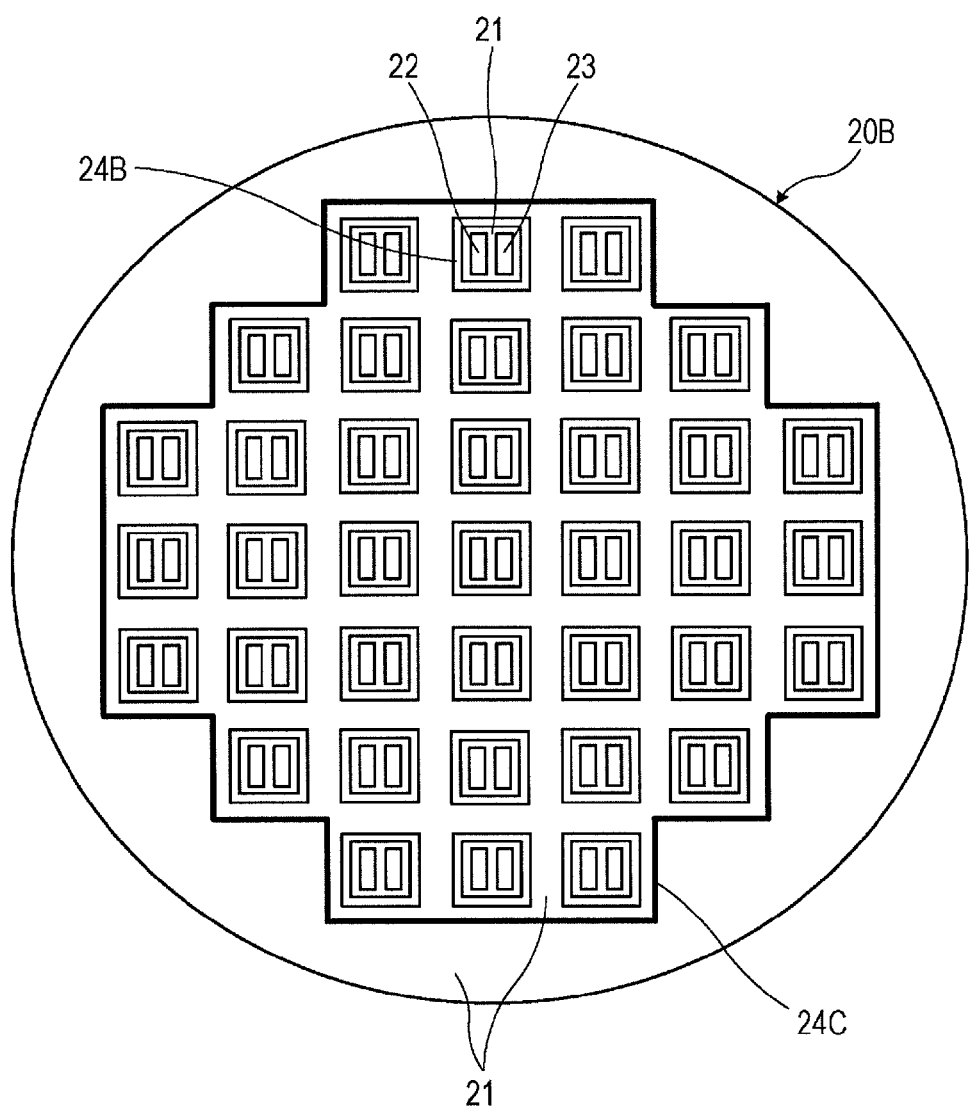
FIG. 26 is a diagram (Part 2) illustrating another example of a frame according to the third embodiment.
Figure 27:
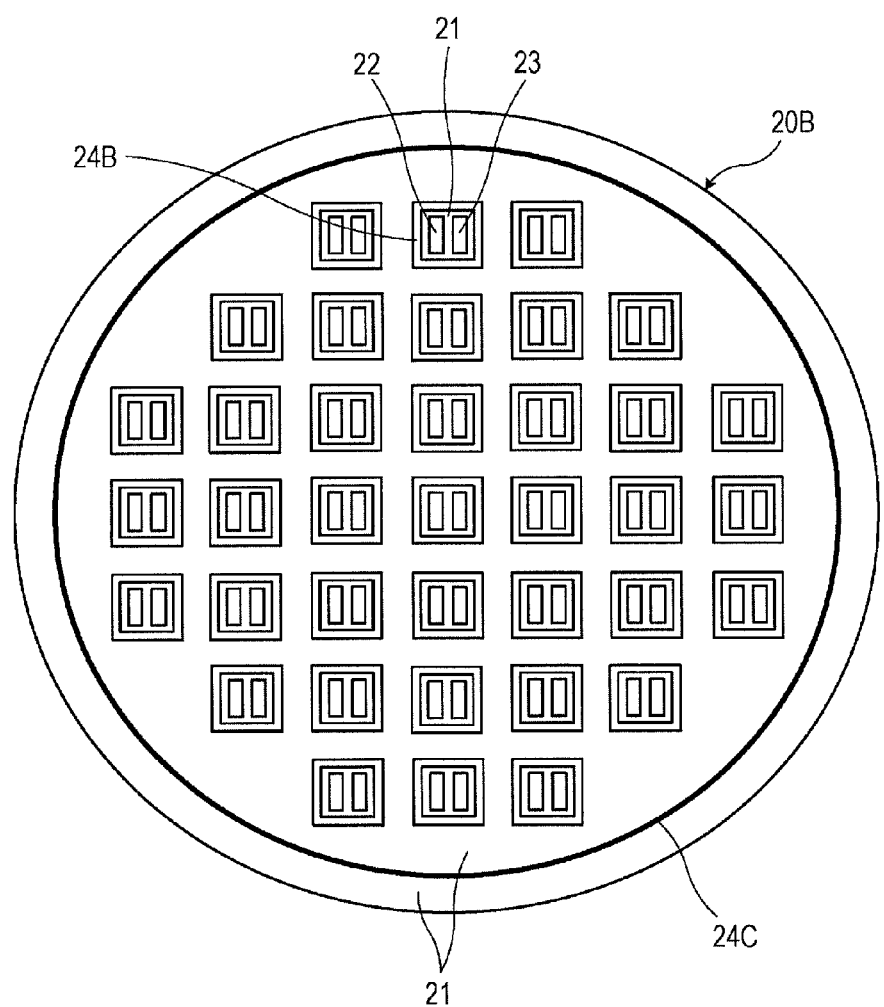
FIG. 27 is a diagram (Part 3) illustrating another example of a frame according to the third embodiment.

Also, as illustrated in FIG. 26, the frame 24C may be disposed along the outer side of the outermost frame 24B so as to surround all of the frames 24B. Also, as illustrated in FIG. 27, the frame 24C may be disposed in a circumferential shape along the edge portions of the built-in chip substrate 20B so as to surround all of the frames 24B. Even in the event of employing such a frame 24C, the warpage of the built-in chip substrate 20B may be suppressed.

Figure 28:
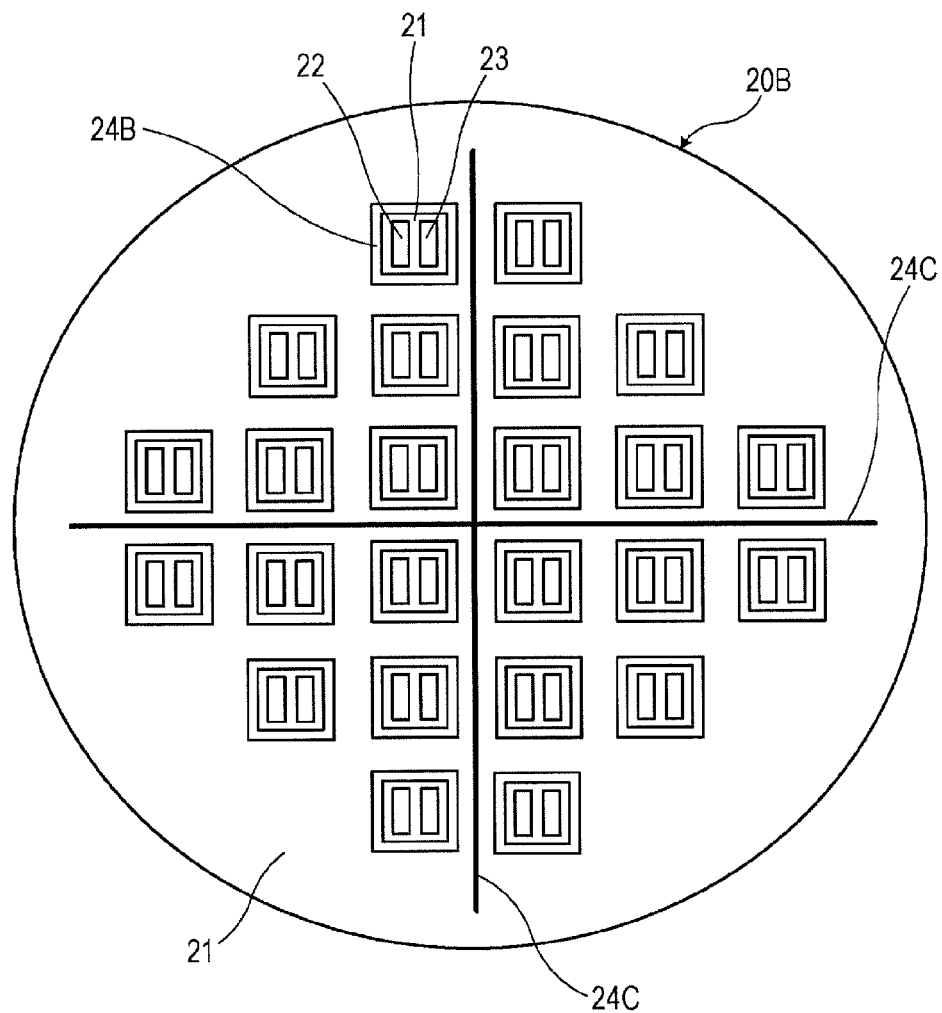
FIG. 28 is a diagram (Part 4) illustrating another example of a frame according to the third embodiment.

Also, as illustrated in FIG. 28, the frame 24C may be disposed in each of the vertical direction and horizontal direction so as to pass through the center of the built-in chip substrate 20B between the frames 24B disposed in parallel at the center of the built-in chip substrate 20B. Even in the event of employing such a frame 24C, the warpage of the built-in chip substrate 20B may be suppressed.

Note that the frames 24C illustrated in FIGS. 25 through 28 may be employed independently or may be employed with a combination as to one sheet of built-in chip substrate 20B.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
    an insulation layer;
    a first semiconductor element and a second semiconductor element which are disposed within the insulation layer;
    a frame that has higher thermal conductivity than the insulation layer and surrounds the first semiconductor element and the second semiconductor element via the insulation layer, wherein the frame is not disposed between the first semiconductor element and the second semiconductor element; and
    a wiring layer that is disposed over the insulation layer and includes an electrode which electrically connects the first semiconductor element and the second semiconductor element.

2. A semiconductor device, comprising:
    an insulation layer;
    a first semiconductor element and a second semiconductor element which are disposed within the insulation layer;
    a frame that has higher thermal conductivity than the insulation layer and surrounds the first semiconductor element and the second semiconductor element via the insulation layer; and
    a wiring layer that is disposed over the insulation layer and includes an electrode which electrically connects the first semiconductor element and the second semiconductor element, wherein the wiring includes a frame portion.

3. The semiconductor device according to claim 2, wherein the frame portion surrounds an area including the electrode and is connected to the frame.

4. The semiconductor device according to claim 2, further comprising:
    a layer which is disposed on a side face opposite of a side face where the wiring layer of the insulation layer is disposed, has higher thermal conductivity than the insulation layer and is connected to the frame.

5. The semiconductor device according to claim 4,
wherein the layer is in contact with at least one of the first semiconductor element and the second semiconductor element.

6. The semiconductor device according to claim 2,
wherein distance between the first semiconductor element and the second semiconductor element, and the frame is equal to distance between the first semiconductor element and the second semiconductor element.

7. A semiconductor device manufacturing method, comprising:
forming a substrate including
an insulation layer,
a first semiconductor element and a second semiconductor element which are disposed within a first area of the insulation layer, and
a first frame which is disposed within the insulation layer, has higher thermal conductivity than the insulation layer and surrounds the first semiconductor element and the second semiconductor element via the insulation layer of the first area, wherein the first frame is not disposed between the first semiconductor element and the second semiconductor element;
forming a wiring layer including a first electrode which is electrically connected to the first semiconductor element and the second semiconductor element over the substrate; and
cutting the wiring layer and the substrate so that the insulation layer of the first area is surrounded with at least a portion of the first frame.

8. A semiconductor device manufacturing method, comprising:
forming a substrate including
an insulation layer,
a first semiconductor element and a second semiconductor element which are disposed within a first area of the insulation layer, and
a first frame which is disposed within the insulation layer, has higher thermal conductivity than the insulation layer and surrounds the first semiconductor element and the second semiconductor element via the insulation layer of the first area;
forming a wiring layer including a first electrode which is electrically connected to the first semiconductor element and the second semiconductor element over the substrate; and
cutting the wiring layer and the substrate so that the insulation layer of the first area is surrounded with at least a portion of the first frame,
wherein the substrate to be formed further includes
a third semiconductor element and a fourth semiconductor element which are disposed within a second area of the insulation layer, and
a second frame which is disposed within the insulation layer, has higher thermal conductivity than the insulation layer and surrounds the third semiconductor element and the fourth semiconductor element via the insulation layer of the second area,
wherein the wiring layer to be formed further includes a second electrode electrically connected to the third semiconductor element and the fourth semiconductor element, and
wherein the process arranged to cut the wiring layer and the substrate includes
cutting the wiring layer and the substrate so that, with a position between the first frame and the second frame, the insulation layer of the first area is surrounded with at least a portion of the first frame, and also the insulation layer of the second area is surrounded with at least a portion of the second frame.

9. The semiconductor device manufacturing method according to claim 8, wherein the forming of the substrate includes
disposing the first frame and the second frame over a support member,
disposing the first semiconductor element and the second semiconductor element within the first frame,
disposing the third semiconductor element and the fourth semiconductor element within the second frame,
forming the insulation layer over the support member, and to embed the first frame and the second frame, and the first semiconductor element, the second semiconductor element, the third semiconductor element, and the fourth semiconductor element in the insulation layer, and
peeling the support member from the insulation layer.

10. The semiconductor device manufacturing method according to claim 9,
wherein the forming of the substrate includes a process arranged to extend and dispose a third frame so as to pass through between the first frame and the second frame over the support member.

11. The semiconductor device manufacturing method according to claim 9,
wherein the forming of the substrate includes a process arranged to extend and dispose a fourth frame so as to surround an area including the first frame and the second frame over the support member.

12. The semiconductor device manufacturing method according to claim 9,
wherein the first frame and the second frame are integrated.

13. The semiconductor device manufacturing method according to claim 8,
wherein the first semiconductor element and the second semiconductor element have a first electrode pad and a second electrode pad which are exposed from the insulation layer, respectively,
wherein the first electrode is electrically connected to the first electrode pad and the second electrode pad,
wherein the third semiconductor element and the fourth semiconductor element have a third electrode pad and a fourth electrode pad which are exposed from the insulation layer, respectively, and
wherein the second electrode is electrically connected to the third electrode pad and the fourth electrode pad.

14. The semiconductor device manufacturing method according to claim 8,
wherein the forming of the wiring layer includes
forming a first frame portion which surrounds an area including the first electrode and is connected to the first frame, and a second frame portion which surrounds an area including the second electrode and is connected to the second frame.

15. The semiconductor device manufacturing method according to claim 8, further comprising:
a process, performed after the process to form the substrate, arranged to form a layer on a face side opposite of a forming face of the wiring layer of the insulation layer which has higher thermal conductivity than the insulation layer and is connected to the first frame and the second layer.

16. A substrate, comprising:
an insulation layer;
a first semiconductor element and a second semiconductor element which are disposed within a first area of the insulation layer;
a first frame which is disposed within the insulation layer, has higher thermal conductivity than the insulation layer and surrounds the first semiconductor element and the second semiconductor element via the insulation layer of the first area;
a third semiconductor element and a fourth semiconductor element which are disposed within a second area of the insulation layer; and
a second frame which is disposed within the insulation layer, has higher thermal conductivity than the insulation layer and surrounds the third semiconductor element and the fourth semiconductor element via the insulation layer of the second area.

17. The substrate according to claim 16, further comprising:
a third frame which is disposed within the insulation layer and is extended passing through between the first frame and the second frame.

18. The substrate according to claim 16, further comprising:
a fourth frame which is disposed within the insulation layer and is extended so as to surround an area including the first frame and the second frame.

19. The substrate according to claim 16,
wherein the insulation layer is made of resin, and
wherein the first frame and the second frame are integrated.

20. The semiconductor device according to claim 2,
wherein the insulation layer is made of resin,
wherein the first semiconductor element and the second semiconductor element have a first electrode pad and a second electrode pad which are exposed from the insulation layer, respectively, and
wherein the electrode is electrically connected to the first electrode pad and the second electrode pad.

* * * * *